(12) United States Patent
Lu

(10) Patent No.: US 12,159,936 B2
(45) Date of Patent: Dec. 3, 2024

(54) TRANSISTOR STRUCTURE AND PROCESSING METHOD THEREFORE

(71) Applicants: INVENTION AND COLLABORATION LABORATORY PTE. LTD., Singapore (SG); ETRON TECHNOLOGY, INC., Hsinchu (TW)

(72) Inventor: Chao-Chun Lu, Taipei (TW)

(73) Assignees: INVENTION AND COLLABORATION LABORATORY PTE. LTD., Singapore (SG); ETRON TECHNOLOGY, INC., Hsinchu (TW)

( * ) Notice: Subject to any disclaimer, the term of this patent is extended or adjusted under 35 U.S.C. 154(b) by 160 days.

(21) Appl. No.: 17/394,662

(22) Filed: Aug. 5, 2021

(65) Prior Publication Data

US 2022/0320328 A1    Oct. 6, 2022

Related U.S. Application Data

(60) Provisional application No. 63/173,537, filed on Apr. 12, 2021, provisional application No. 63/171,133, filed on Apr. 6, 2021.

(51) Int. Cl.
*H01L 29/78*    (2006.01)
*H01L 29/417*   (2006.01)
*H01L 29/66*    (2006.01)

(52) U.S. Cl.
CPC ...... *H01L 29/785* (2013.01); *H01L 29/41791* (2013.01); *H01L 29/66795* (2013.01)

(58) Field of Classification Search
CPC ............ H01L 29/785; H01L 29/41791; H01L 29/66795; H01L 29/1054; H01L 29/0684; H01L 29/1033
See application file for complete search history.

(56) References Cited

U.S. PATENT DOCUMENTS

| | | | |
|---|---|---|---|
| 6,071,783 A | 6/2000 | Liang et al. | |
| 9,136,329 B2 | 9/2015 | Huang et al. | |
| 2005/0285212 A1* | 12/2005 | Tolchinsky | ......... H01L 29/1054 257/E21.426 |
| 2006/0131657 A1 | 6/2006 | Hamaguchi | |
| 2008/0169490 A1 | 7/2008 | Kawai | |
| 2009/0224287 A1 | 9/2009 | Shin et al. | |

(Continued)

FOREIGN PATENT DOCUMENTS

DE    197 49 378 A1    5/1999
WO    WO 2011/064891 A1    6/2011

OTHER PUBLICATIONS

U.S. Office Action dated Dec. 23, 2022 for U.S. Appl. No. 17/318,097.
(Continued)

*Primary Examiner* — Shouxiang Hu
(74) *Attorney, Agent, or Firm* — Birch, Stewart, Kolasch & Birch, LLP

(57) ABSTRACT

A transistor structure includes a semiconductor substrate, a channel layer, a gate structure and a first conductive region. The semiconductor substrate includes a semiconductor surface. The channel layer is independent from the semiconductor substrate and covers the semiconductor surface. The gate structure, covers the channel layer. The first conductive region is coupled to the channel layer.

22 Claims, 24 Drawing Sheets

(56) References Cited

U.S. PATENT DOCUMENTS

| | | |
|---|---|---|
| 2009/0267149 A1 | 10/2009 | Hua et al. |
| 2011/0049643 A1 | 3/2011 | Matsuoka |
| 2013/0210207 A1 | 8/2013 | Fukuda et al. |
| 2013/0316509 A1 | 11/2013 | Qin et al. |
| 2014/0191318 A1 | 7/2014 | Lin et al. |
| 2014/0217519 A1 | 8/2014 | Qin et al. |
| 2014/0252426 A1* | 9/2014 | Huang ............... H01L 29/0653 257/288 |
| 2014/0264445 A1 | 9/2014 | Xiao |
| 2014/0264592 A1* | 9/2014 | Oxland ............... H01L 29/785 257/347 |
| 2014/0312387 A1* | 10/2014 | Kim ............... H01L 29/785 257/192 |
| 2018/0286962 A1 | 10/2018 | Bao et al. |
| 2019/0096883 A1* | 3/2019 | Chen ............... H01L 29/0649 |
| 2022/0013582 A1* | 1/2022 | Chen ............... H10N 70/826 |
| 2022/0077315 A1 | 3/2022 | Lu |

OTHER PUBLICATIONS

Extended European Search Report for European Application No. 22165703.4, dated Aug. 25, 2022.
U.S. Office Action for U.S. Appl. No. 17/314,233, dated Aug. 5, 2022.
U.S. Office Action for U.S. Appl. No. 17/318,097, dated May 30, 2023.
Japanese Office Action for Japanese Application No. 2022-050169, dated Aug. 1, 2023, with English translation.
U.S. Office Action for U.S. Appl. No. 17/314,233, dated May 17, 2024.
U.S. Office Action for U.S. Appl. No. 17/314,233, dated Feb. 15, 2024.

* cited by examiner

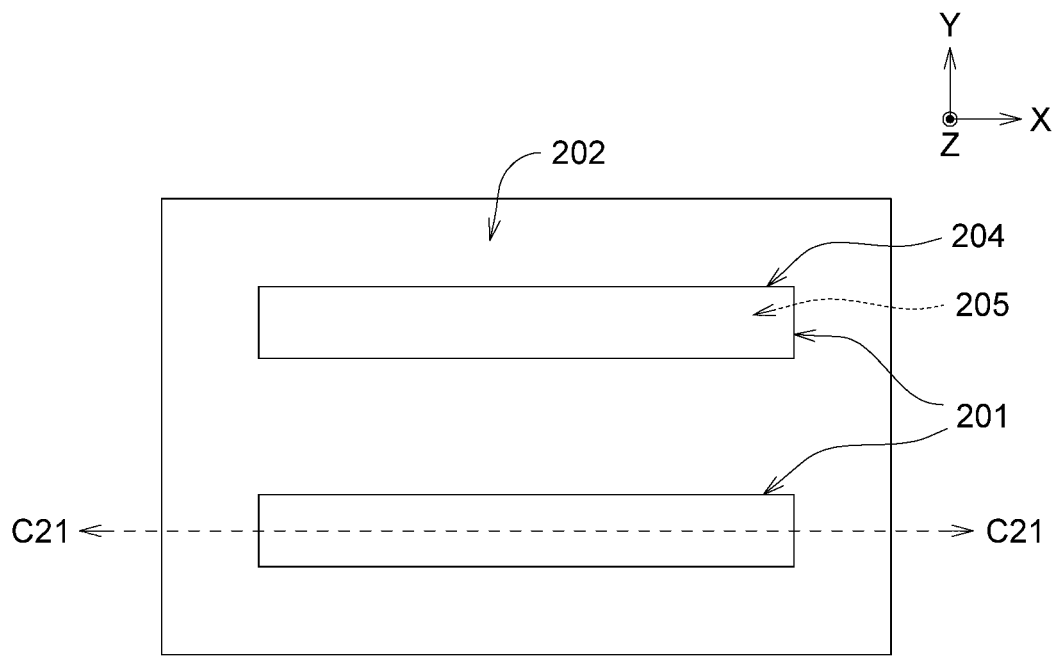
FIG. 2A(1)
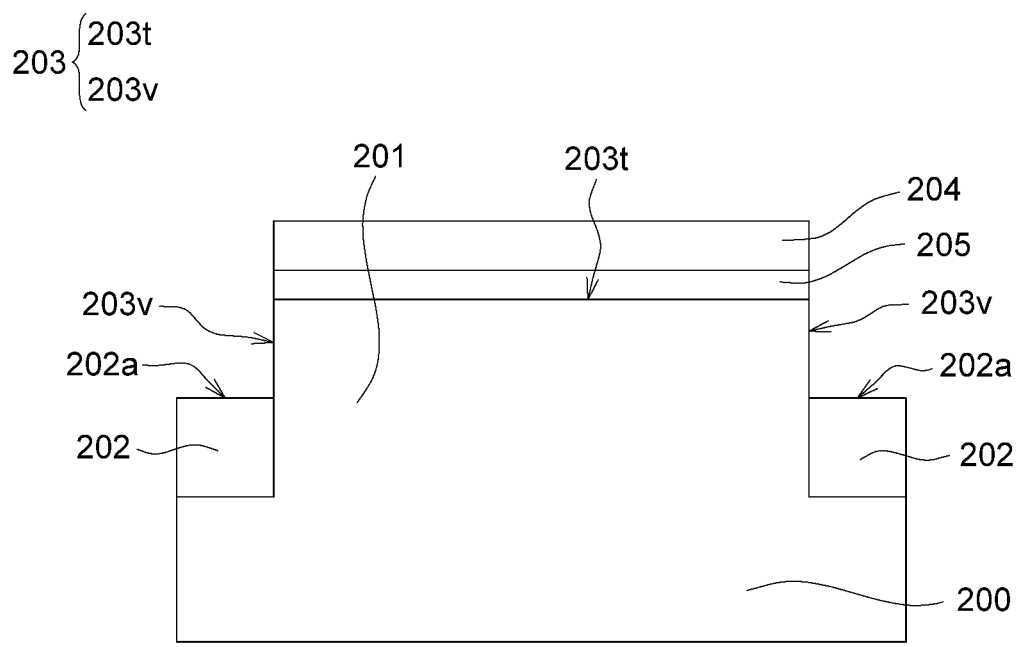
FIG. 2A(2)

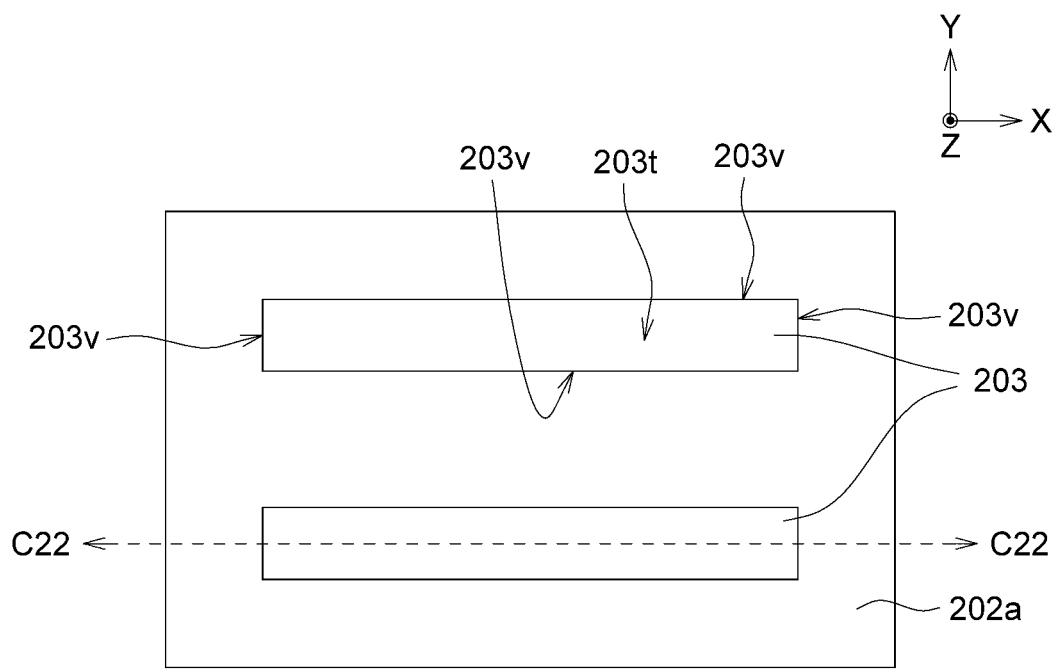
FIG. 2B(1)
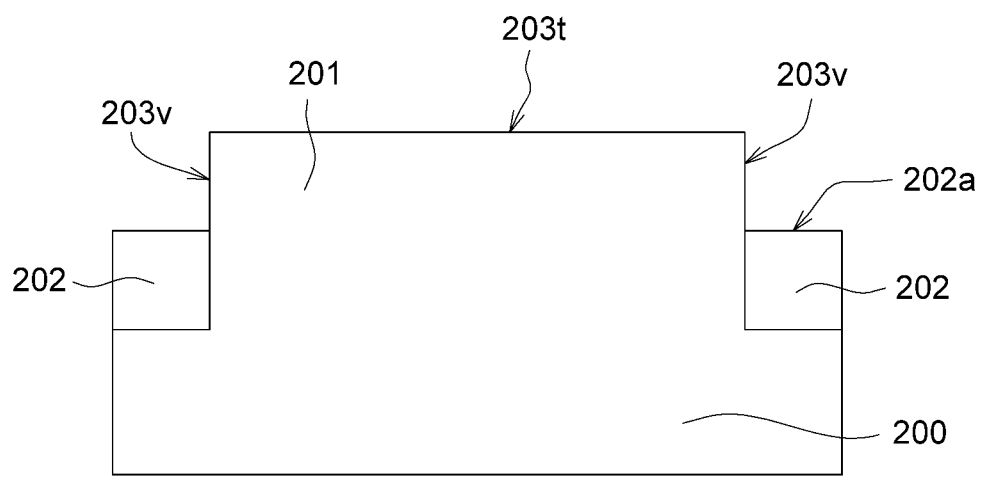
FIG. 2B(2)

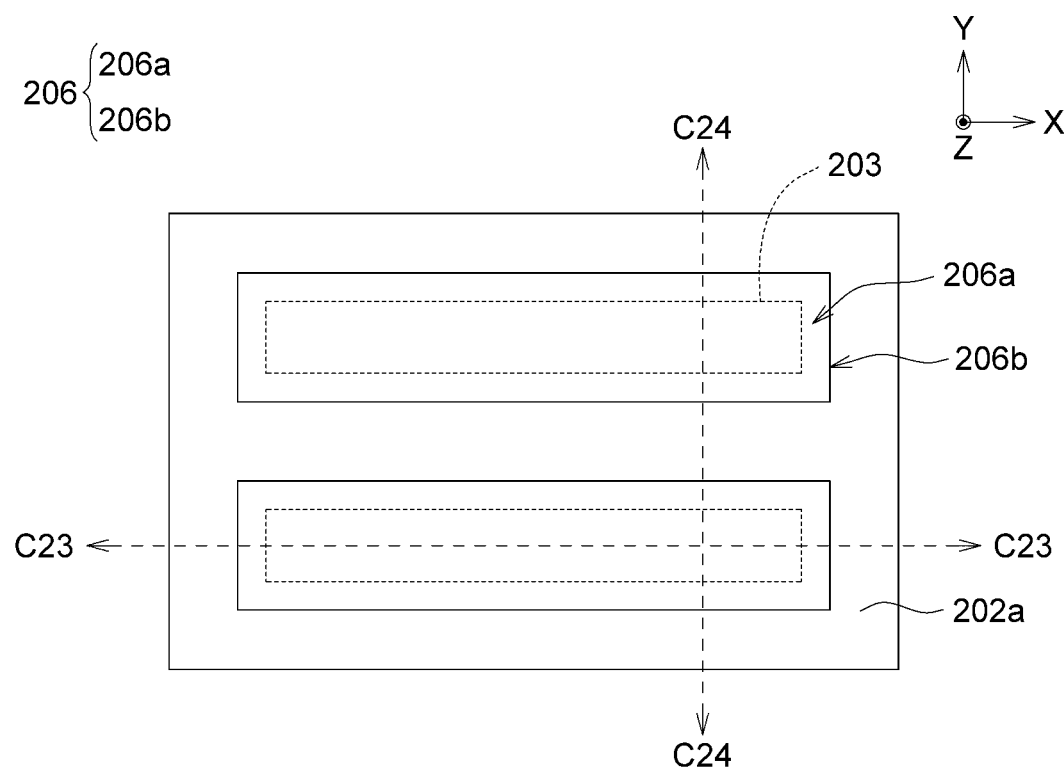
FIG. 2C(1)
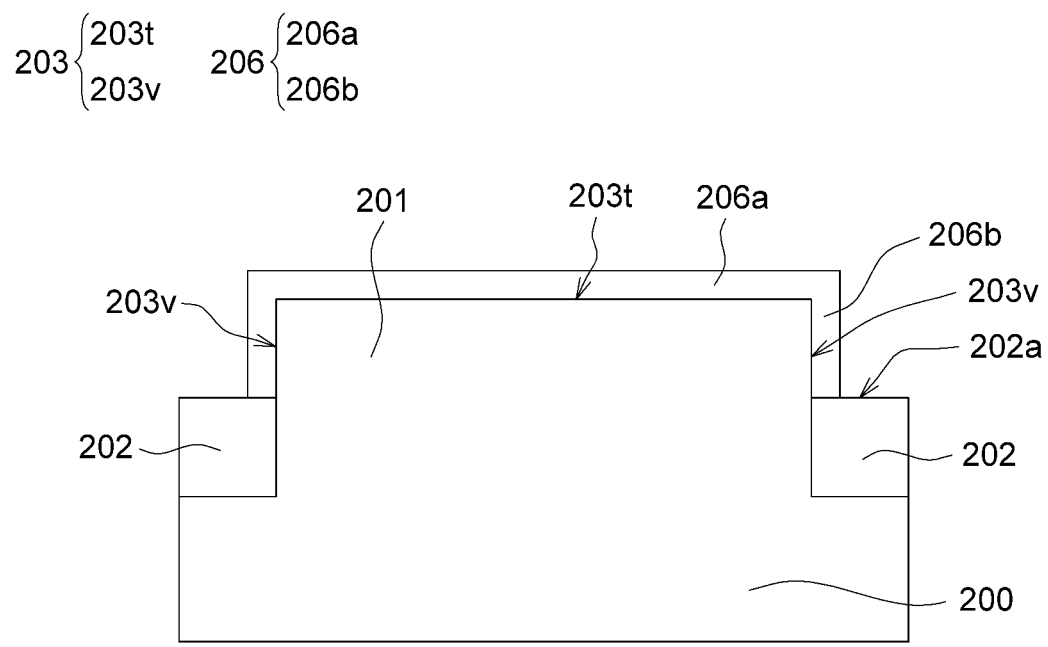
FIG. 2C(2)

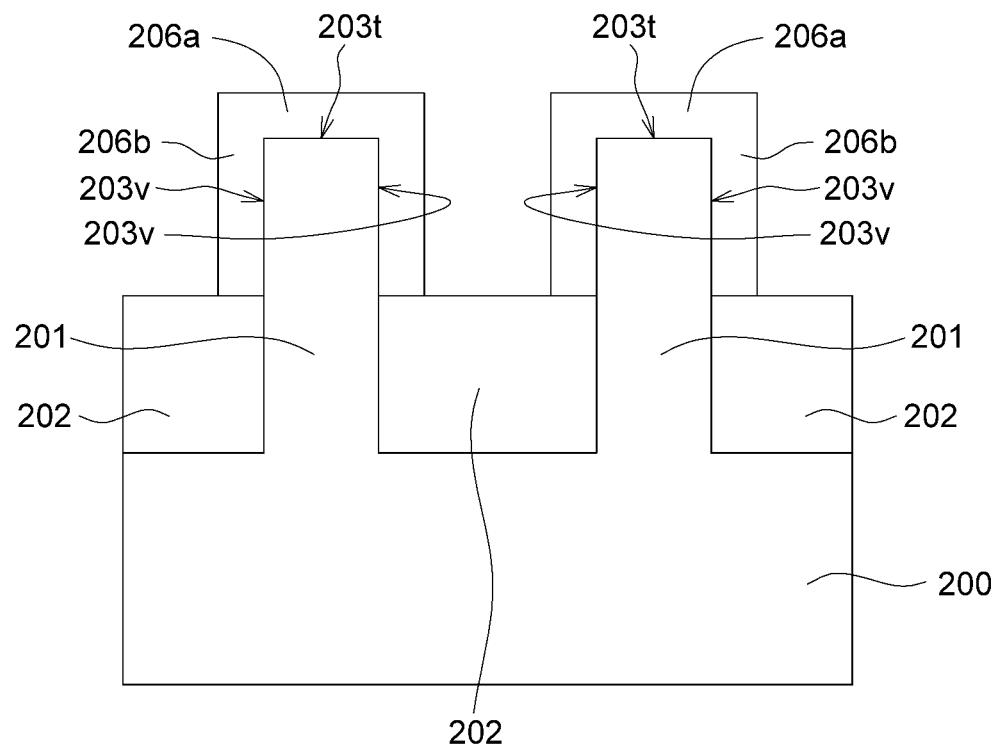
FIG. 2C(3)

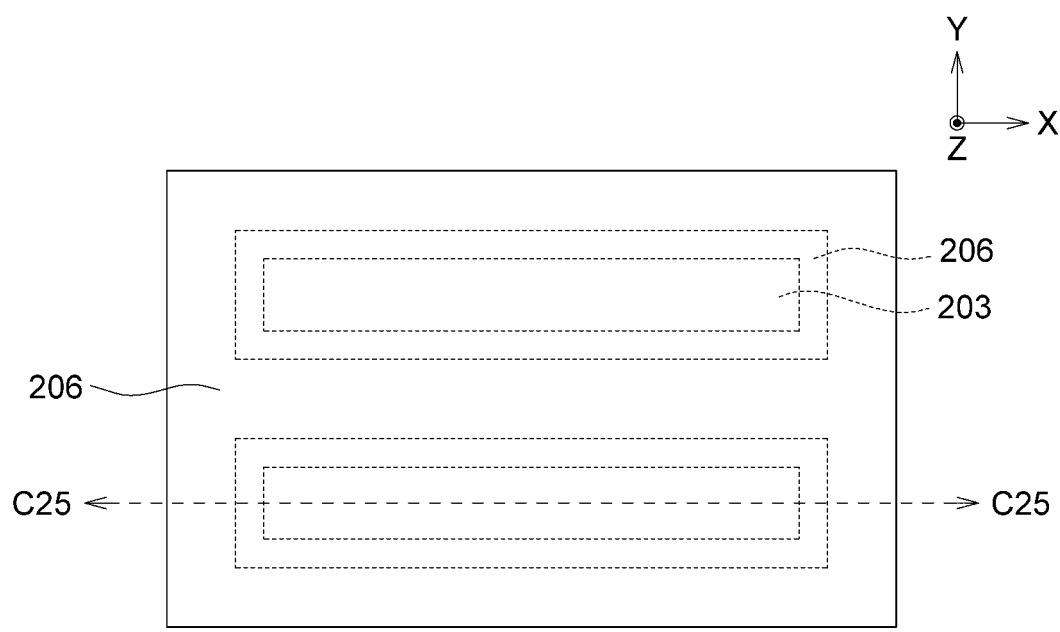
FIG. 2D(1)
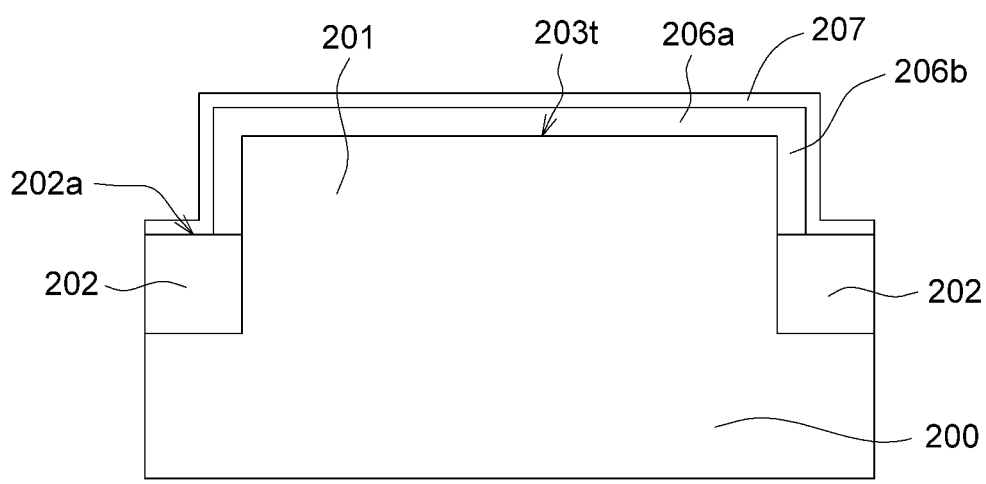
FIG. 2D(2)

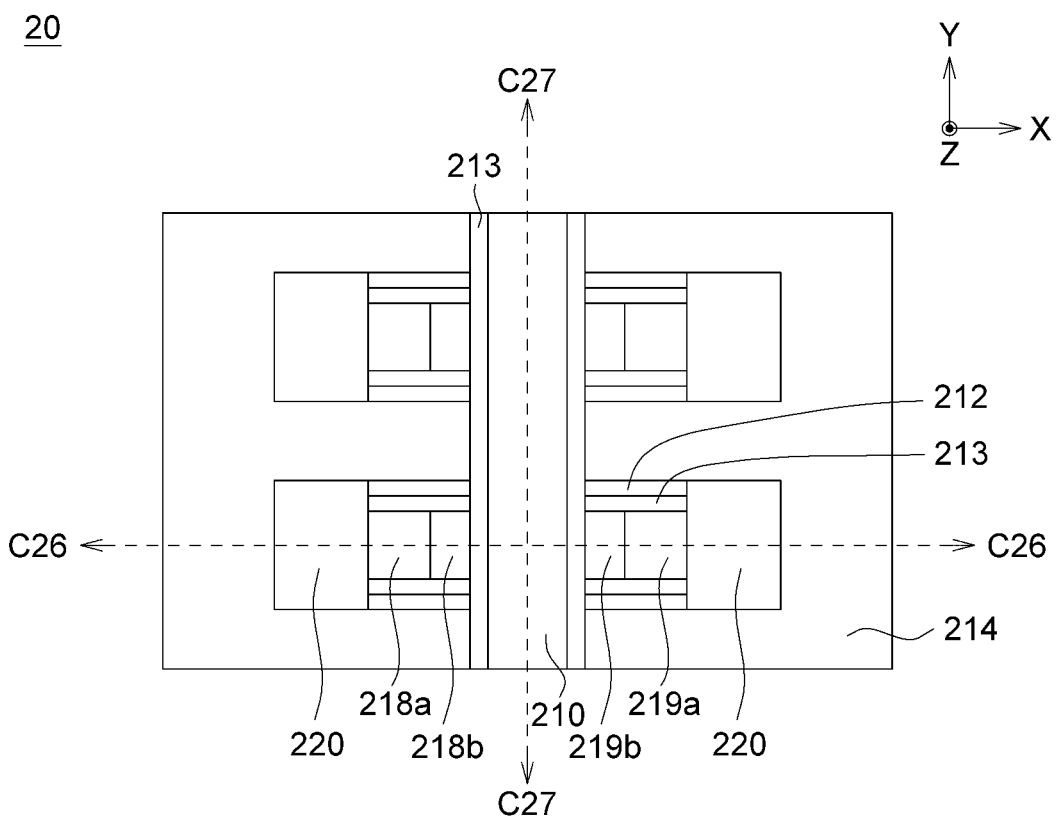
FIG. 2E(1)

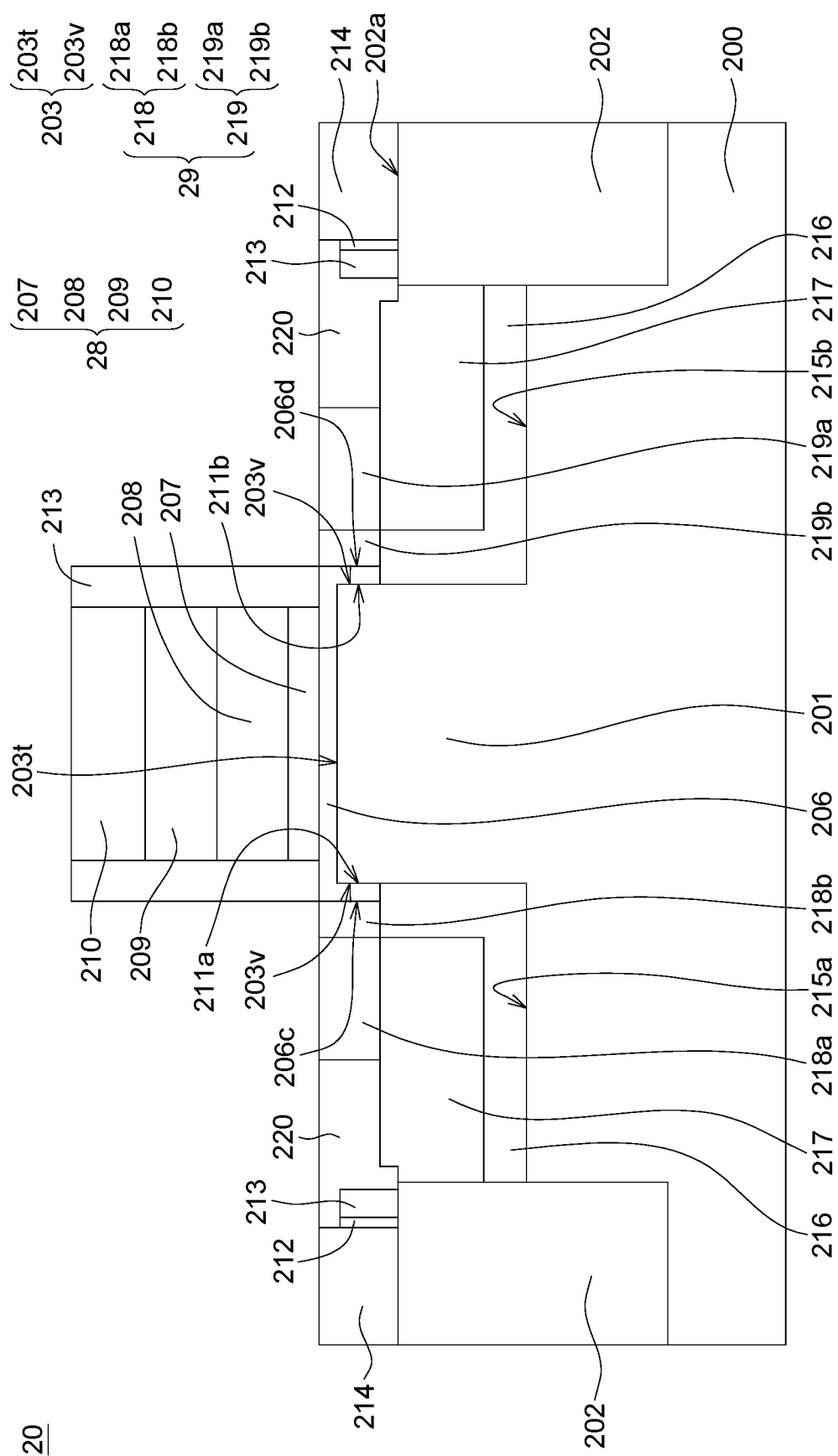
FIG. 2E(2)

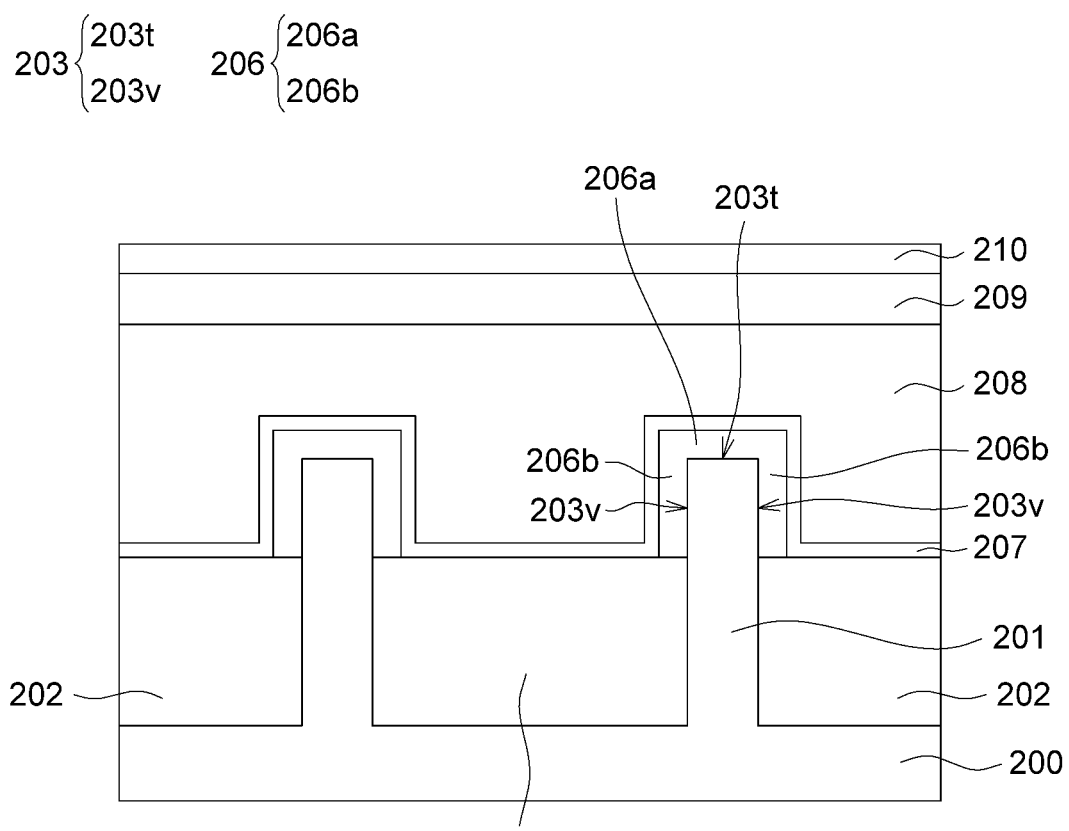
FIG. 2E(3)

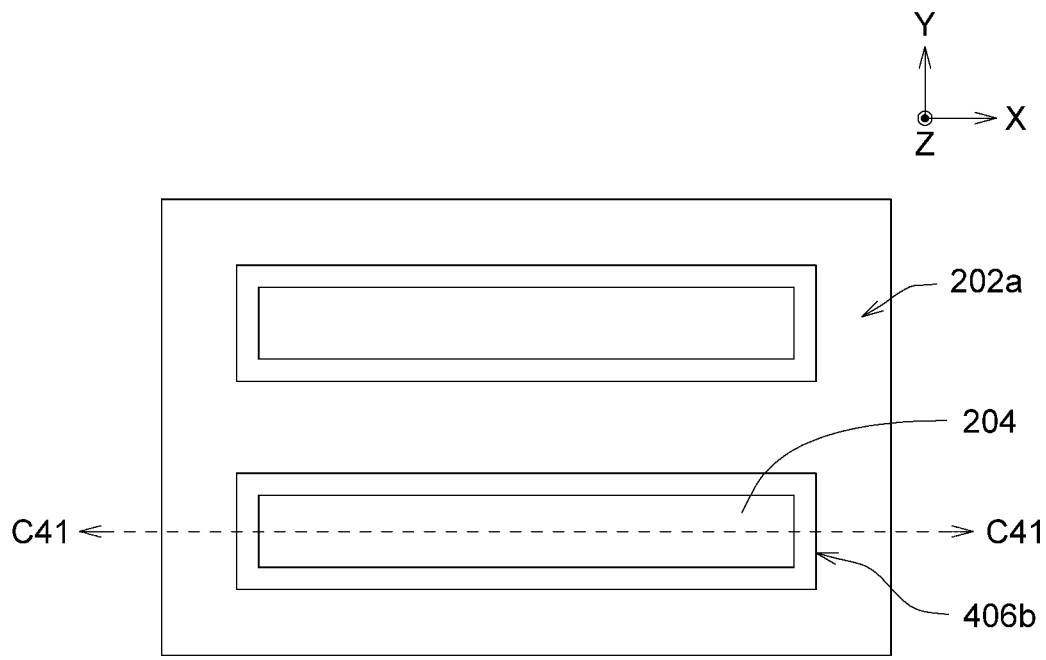
FIG. 4A(1)
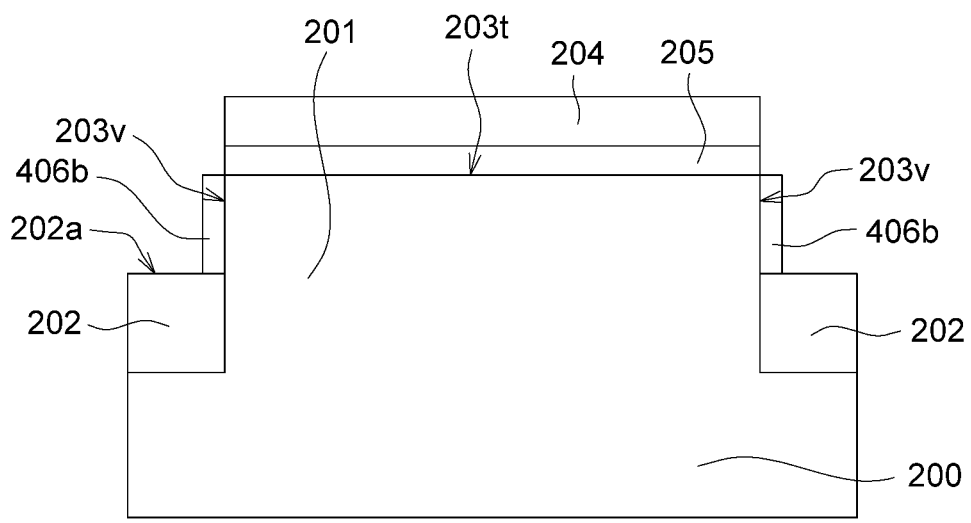
FIG. 4A(2)

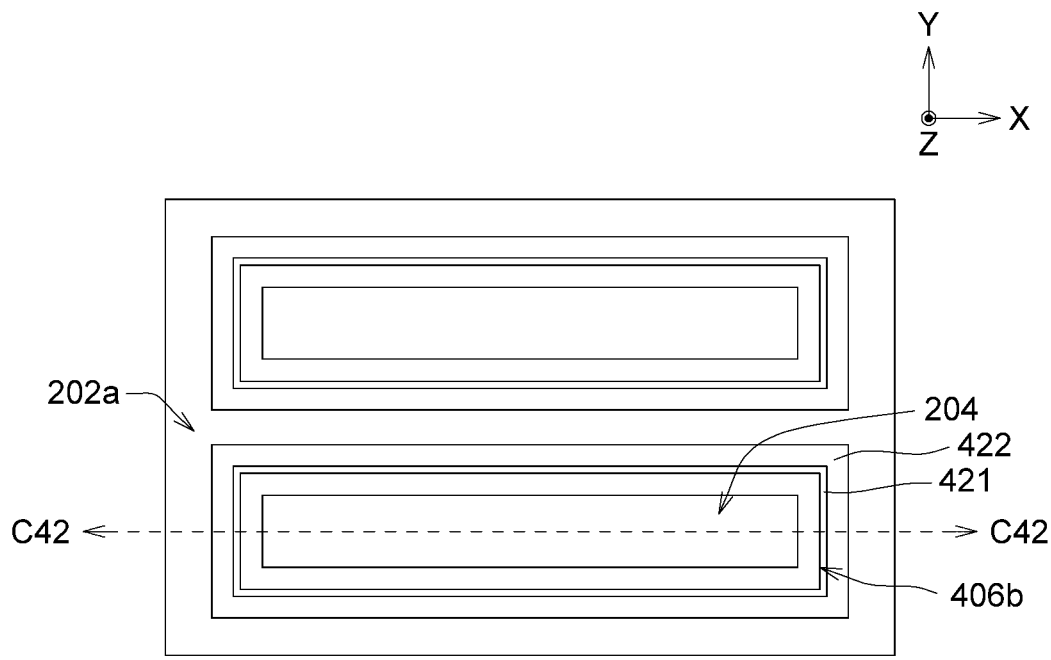
FIG. 4B(1)
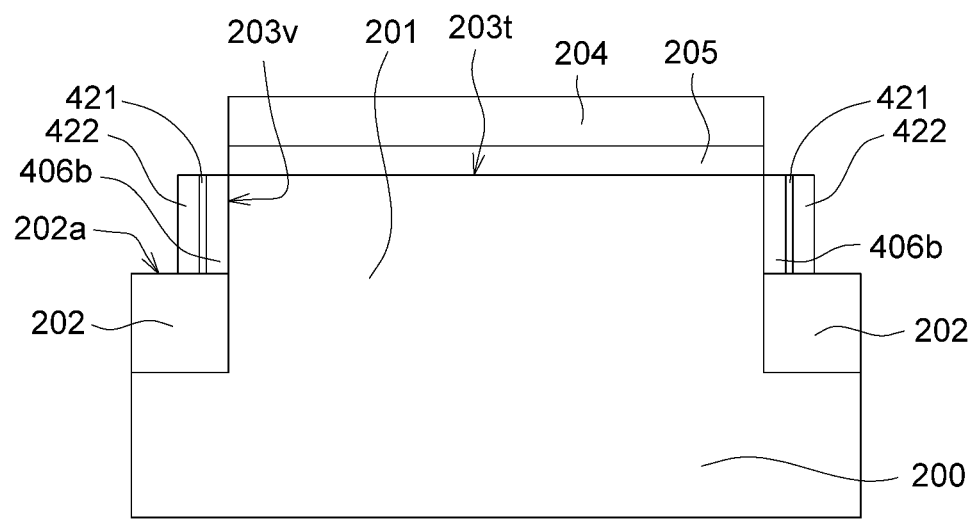
FIG. 4B(2)

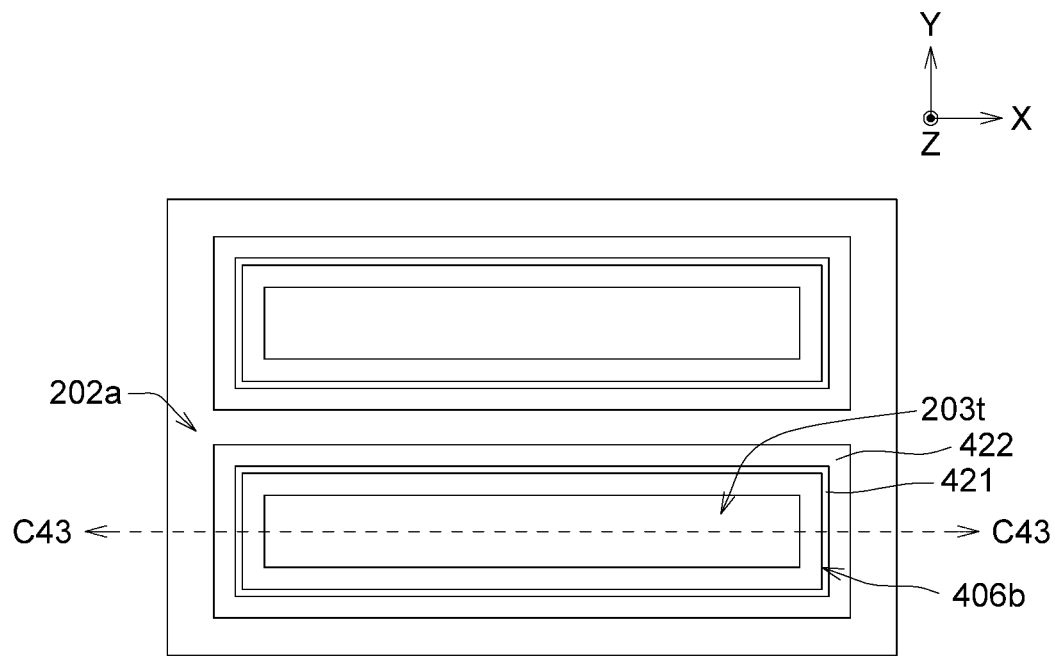
FIG. 4C(1)
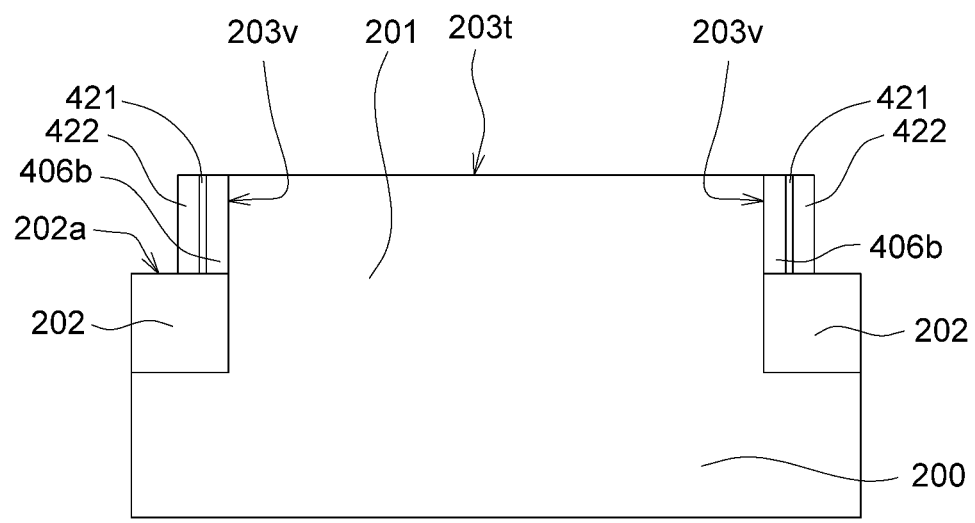
FIG. 4C(2)

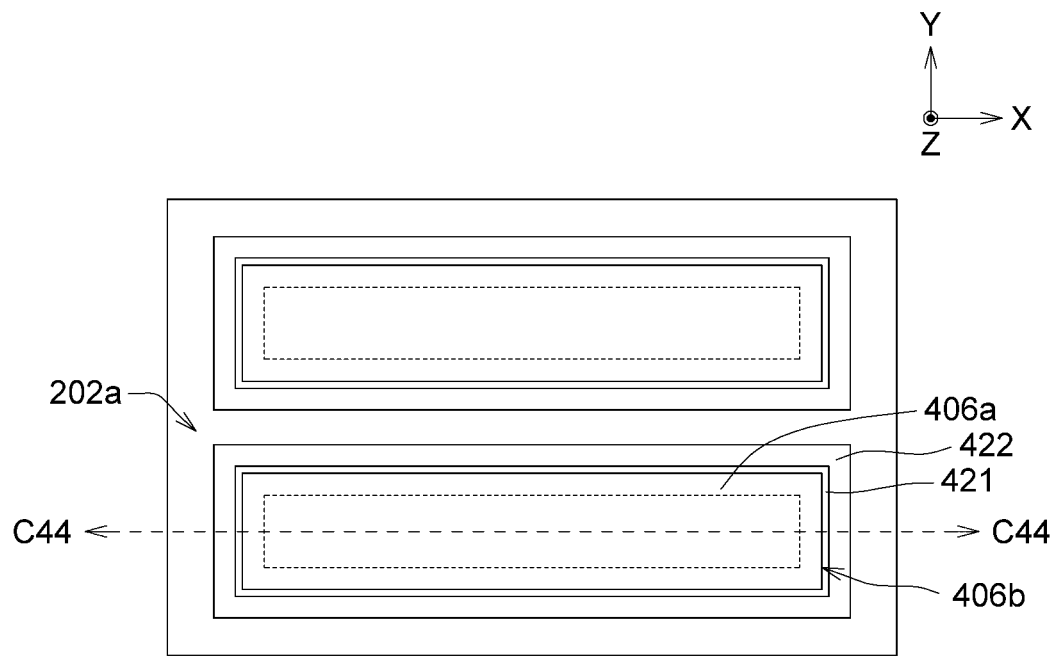
FIG. 4D(1)
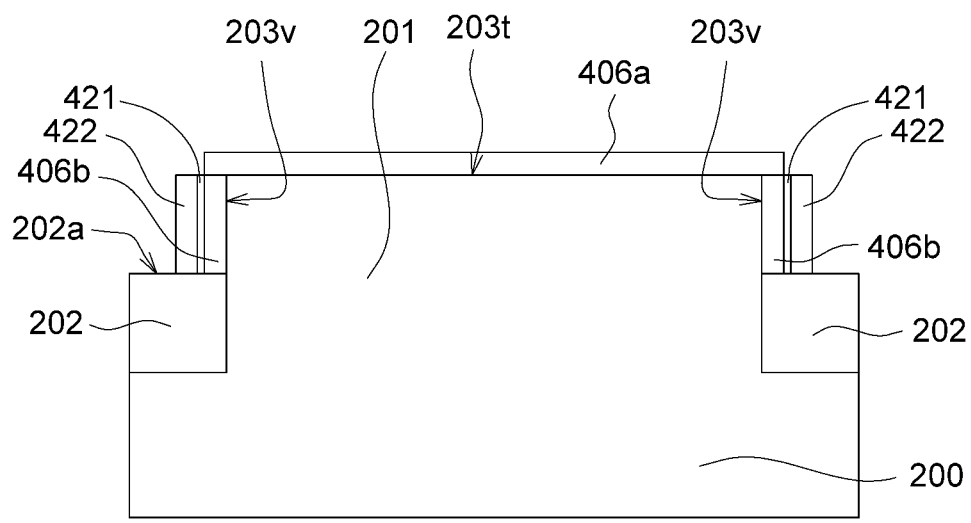
FIG. 4D(2)

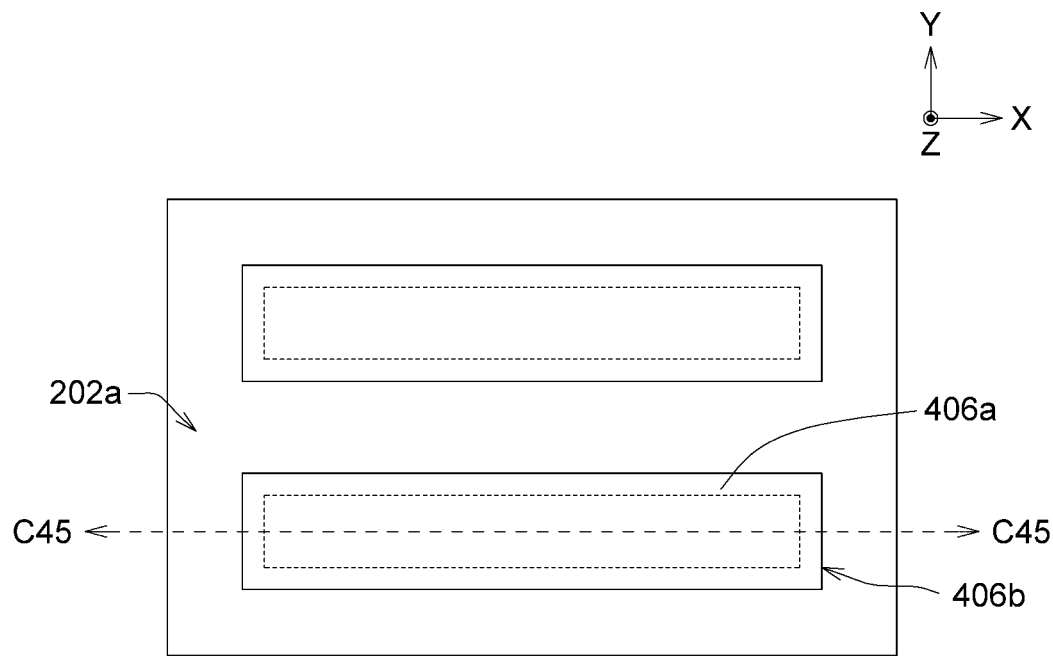
FIG. 4E(1)
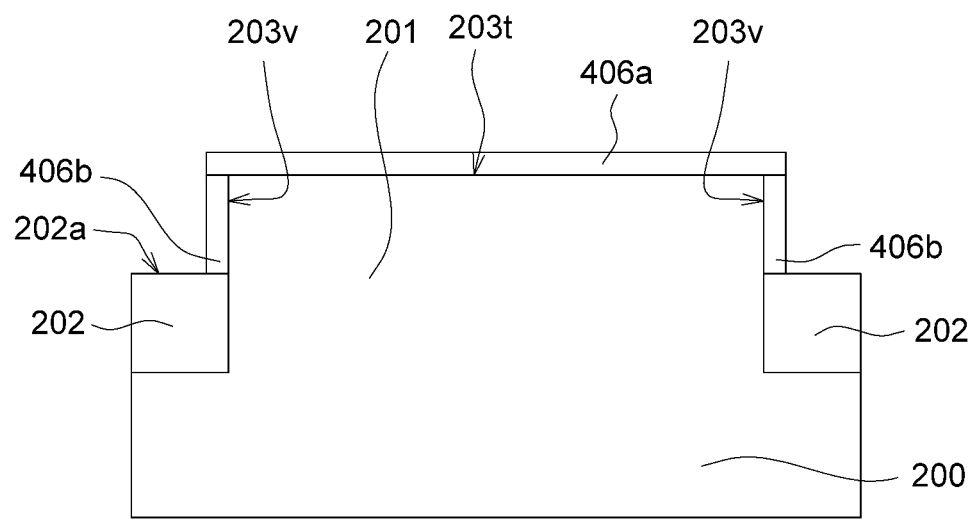
FIG. 4E(2)

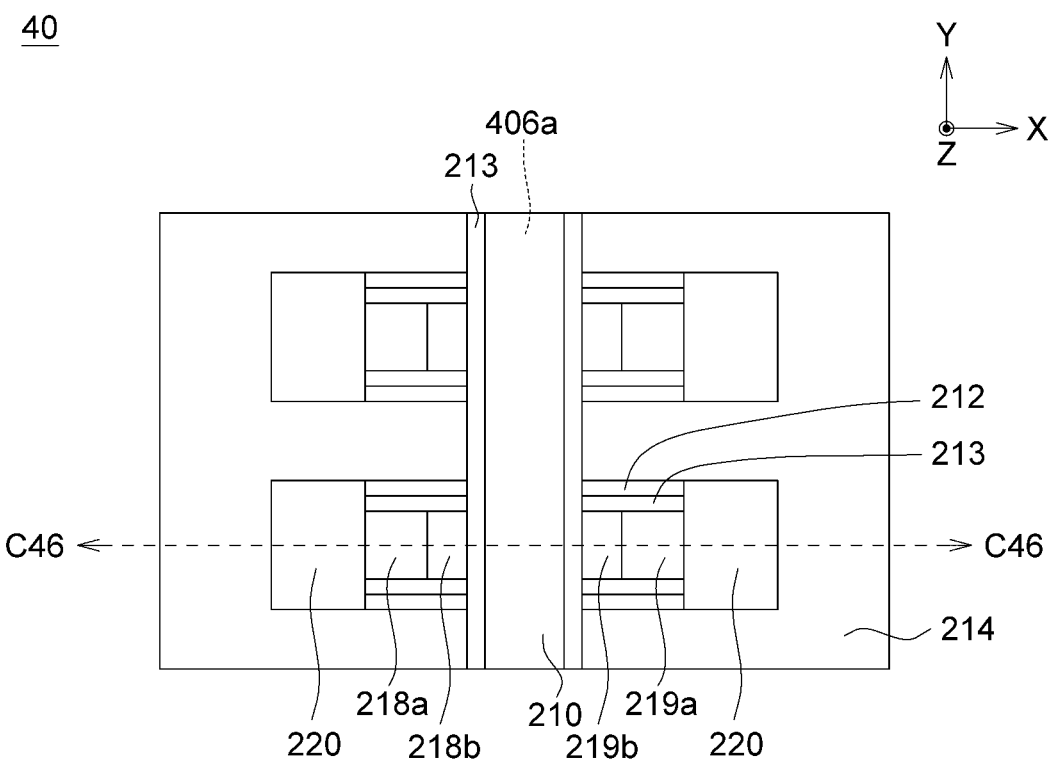
FIG. 4F(1)

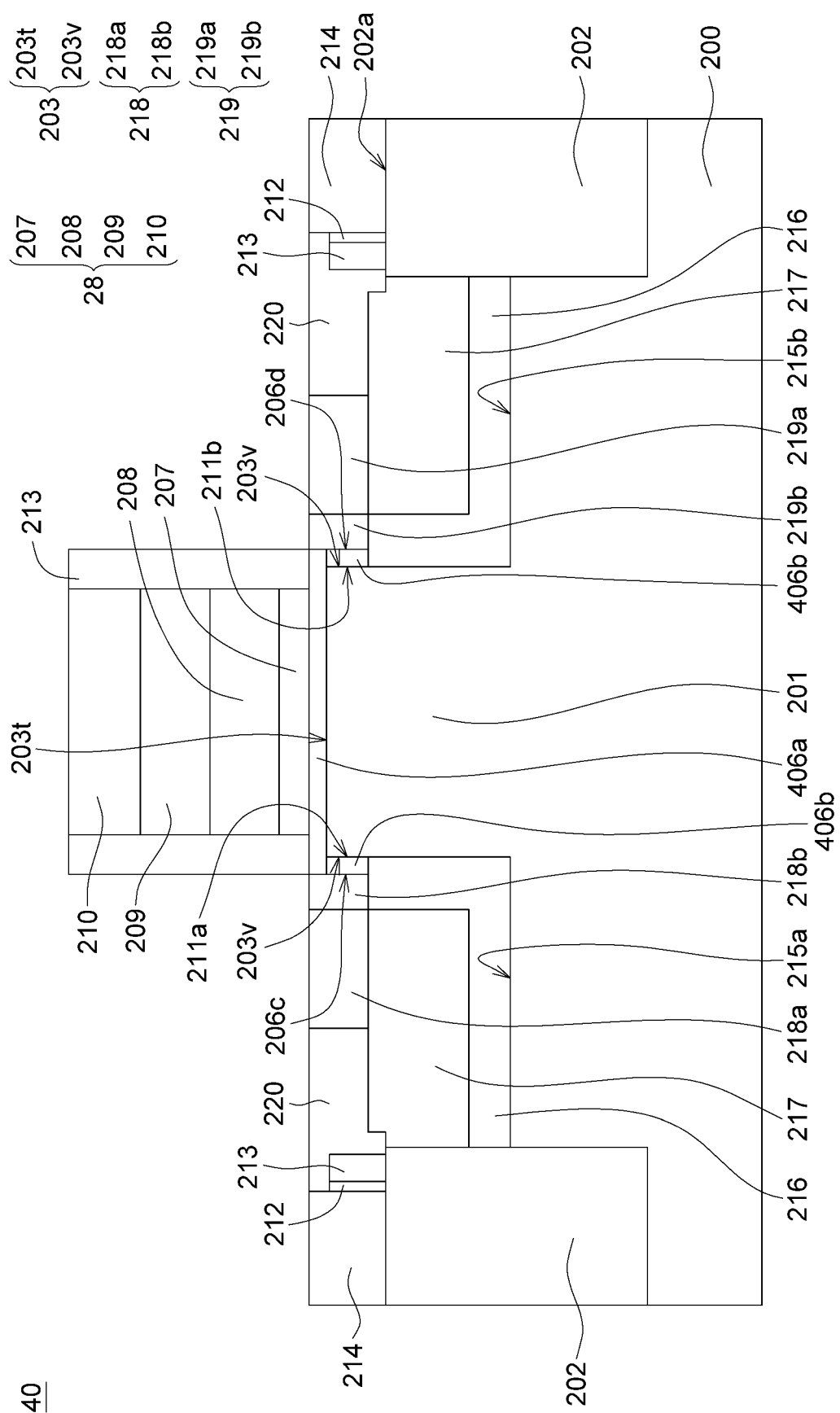
FIG. 4F(2)

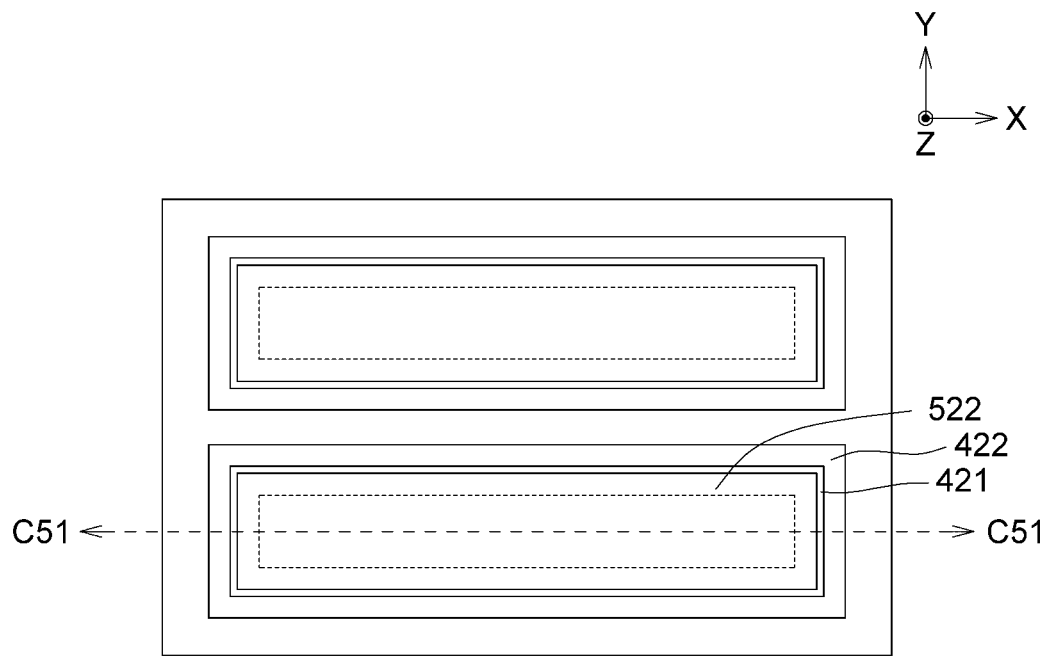
FIG. 5A(1)
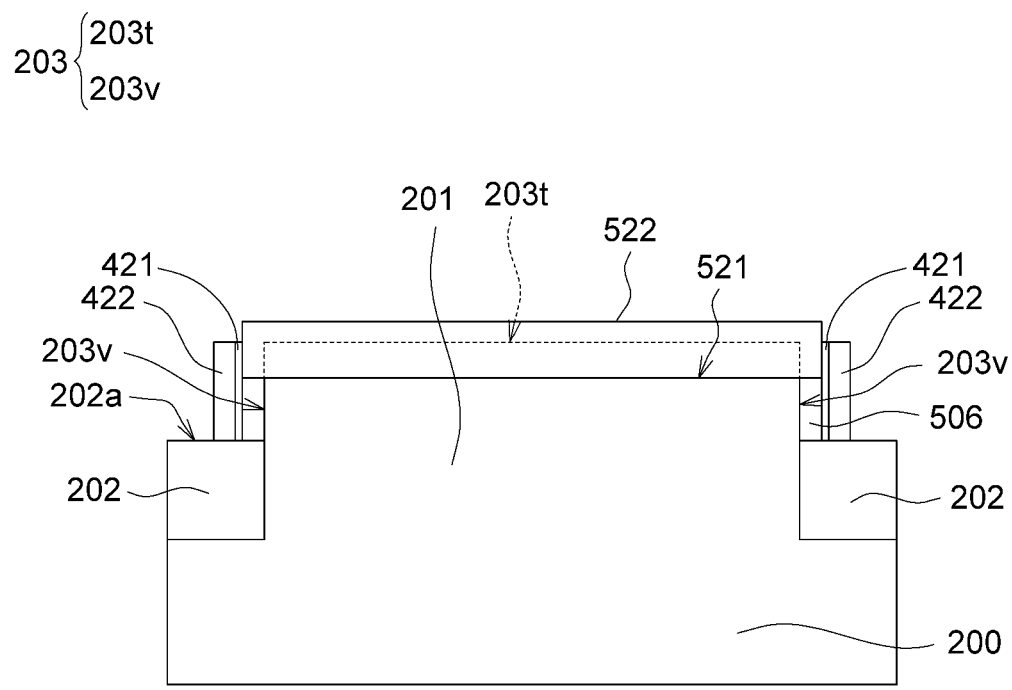
FIG. 5A(2)

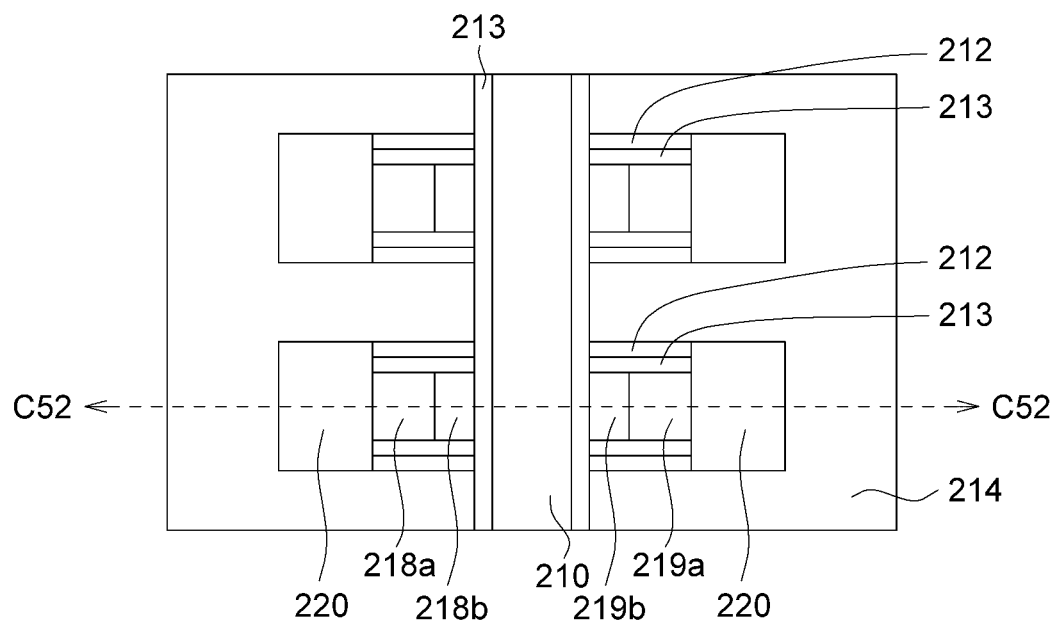
FIG. 5B(1)

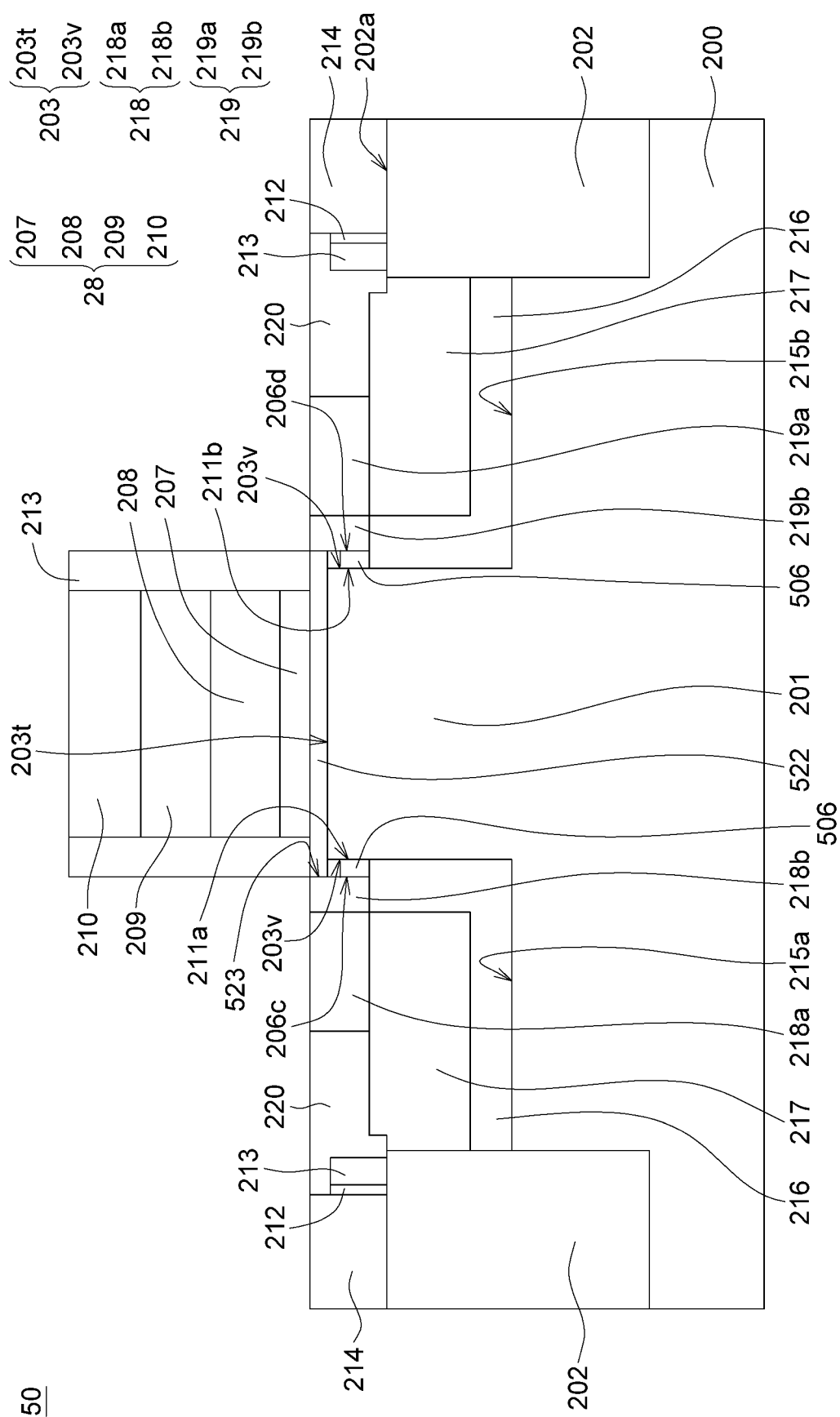
FIG. 5B(2)

TRANSISTOR STRUCTURE AND PROCESSING METHOD THEREFORE

This application claims the benefit of U.S. provisional application Ser. No. 63/171,133, filed Apr. 6, 2021 and U.S. provisional application Ser. No. 63/173,537, filed Apr. 12, 2021, the subject matter of which is incorporated herein by reference.

BACKGROUND OF THE DISCLOSURE

Field of the Disclosure

The disclosure relates in general to a semiconductor structure and the processing method thereof, and more particularly to a transistor structure and the processing method thereof.

Description of the Related Art

The conventional metal-oxide-semiconductor field-effect transistor (MOSFET) uses a planar silicon surface (called as original silicon surface, OSS)) having a thin dielectric layer (eg. Oxide or High-k materials) and a Gate structure (eg. polysilicon, polycide or metal materials) over OSS. Underneath the thin dielectric layer there is some channel doping layer (eg. a layer of boron-dopants by ion-implantation for NMOS and some n-type dopants for PMOS, respectively), thus creating a well-controlled so-called channel region underneath the gate. Such a planar channel region for MOSFET has been used for many technology generations (called technology processing nodes) from several micrometers scaled down to 20 nanometers.

Due to increasing needs of minimizing several device-leakage currents and enhancing the device performance by increasing the W/L (width-to-length) ratio of a transistor channel, however, both gate and channel designs have been changed to a three-dimensional (3D) structure, eg. Tri-gate, fin field-effect transistor (FinFET), and several other stereo-shaped structures for the process nodes below 22 m. Currently the most popular Gate & Channel structure is based on a Fin or Tri-gate 3D shape as shown in FIG. 1.

FIG. 1 is a perspective view illustrating a Tri-gate 3D channel structure 100 of a FinFET 10 according to the prior art. As for the threshold voltage (VT) designed for controlling the transistor channel to be turned on or off, it depends on the choice of channel doping species, their concentrations and suitable design of the work function across gate 11, dielectric (not shown) and channel regions (not shown) by adopting suitable metal material(s) to match the desired gate-to-channel potential. The channel doping profiles must be well controlled but which is not so easy as because the angles induced by the 3D Fin structure 12 must be accurately aligned with so-called the channel-dopant ion-implantations from different angles.

In addition, a high temperature thermal annealing process is required to minimize the quantity of defects which are generated unavoidably by bombardments of implanted ions through the forming process of channel doping regions. Besides, the channel doping profiles along the 3D Fin structure 12 surfaces must be well controlled, though which is not so easy as the angles of the 3D Fin structure 12 must be accurately aligned with separate channel-dopant ion-implantations addressed from different angles.

Another hard-to-control effect is that these channel doping profiles must be kept as much uniform as possible but the 3D channel structure 10 makes such a uniformity of doping profiles around different faucets of the Fin structure 12 very hard to be accomplished. As the minimum feature on the wafer is further scaled down, the gate length and the corresponding channel length CL (both along the X-axis) must be scaled down in order to shrink the transistor size. As for the transistor width (W) that is critical for the transistor performance which affected by W/L, this W is a sum of the width Wt of the top surface of the Fin (which is measured along the Y-axis) and two times of the device vertical width Wv (which is measured along the Z-axis and almost equal to the height of the Fin), which can be expressed as W=Wt+2×Wv.

As scaling on 3D-transistor dimensions is continually advanced, the current design trend needs not only to reduce the width of the Fin structure 12 but also to increase the height of the Fin structure 12 to sustain the transistor width W, which can result in a sharper and taller Fin structure 12 that is harder to control and can hurt the chip yield. The other challenge is when the Fin width 12a (along the Y-axis) is decreased such that the transistor body inside the Fin structure 12 may enter a fully depleted region and lose the neutral body condition which is connected to the fixed voltage supplied from either the p-substrate for NMOS or the n-well for PMOS. Such kind of fully-depleted body condition is not mostly preferred for the optimal transistor operation since the floating potential of the transistor body may cause lower immunity to various noises. Also the leakage current and the short-channel-effect (SCE) may be getting worse.

Therefore, there is a need to provide an advanced transistor structure and the processing method therefor to overcome the drawbacks of the prior art.

SUMMARY OF THE DISCLOSURE

One aspect of the present disclosure is to provide a transistor structure, wherein the transistor structure includes a semiconductor substrate, a channel layer, a gate structure and a first conductive region. The semiconductor substrate includes a semiconductor surface. The channel layer is independent from the semiconductor substrate and covers the semiconductor surface. The gate structure covers the channel layer. The first conductive region is coupled to the channel layer.

In one embodiment of the present disclosure, the semiconductor substrate includes a fin structure and the channel layer covering the fin structure; and the channel layer includes a top portion covering a top surface of the fin structure and a side portion covering a first sidewall and a second sidewall of the fin structure.

In one embodiment of the present disclosure, a composition material of the top portion is the same as that of the side portion.

In one embodiment of the present disclosure, the composition material of the top portion or the side portion includes doped-silicon (Si) or doped-Silicon-germanium (SiGe).

In one embodiment of the present disclosure, the composition material of the top portion or the side portion includes a semiconductor material which is capable of generating conductive inversion caused by a potential applied to the gate structure.

In one embodiment of the present disclosure, the composition material of the top portion or the side portion is formed by a selective epitaxial growth (SEG), an atomic level deposition (ALD), a molecular beam epitaxy (MBE), or a metal-organic chemical vapor deposition (MOCVD).

In one embodiment of the present disclosure, a composition material of the top portion is different from a composition material of the side portion.

In one embodiment of the present disclosure, the composition material of the top portion is formed by a first deposition process, the composition material of the side portion is formed by a second deposition process, and the first deposition process is separate from the second deposition process.

In one embodiment of the present disclosure, the first deposition process or the second deposition process is a SEG, an ALD, a MBE, or a MOCVD.

In one embodiment of the present disclosure, the gate structure includes a gate dielectric layer over the channel layer and a gate conductive layer over the gate dielectric layer.

In one embodiment of the present disclosure, the transistor structure further includes a trench accommodating the first conductive region, wherein the first conductive region is independent from the semiconductor substrate and abuts against a first facet of the channel layer and a first facet of the fin structure, wherein both the first facet of the channel layer and the first facet of the fin structure face the trench.

In one embodiment of the present disclosure, the first conductive region includes a lightly doped drain (LDD) region positioned in the trench; and the LDD region abuts against the first edge of the channel layer and the first facet of the fin structure.

In one embodiment of the present disclosure, the first conductive region further includes a heavily doped region positioned in the trench and abutting against the LDD region.

In one embodiment of the present disclosure, the transistor structure further includes a localized isolation region in the trench and positioned only under the first conductive region.

In one embodiment of the present disclosure, the localized isolation region includes an oxide layer covering a sidewall and a bottom wall of the trench and a localized insulation plug in the trench and covering a portion of the oxide layer which covers the bottom wall of the trench.

Another aspect of the present disclosure is to provide a transistor structure, wherein the transistor structure includes a semiconductor substrate, a channel layer, a gate structure and a first conductive region. the semiconductor substrate includes a semiconductor surface. The channel layer is independent from the semiconductor substrate, wherein a composition material of the channel layer includes a doped semiconductor material and is formed without applying an ion implantation. The gate structure covers the channel layer, wherein the gate structure includes a gate dielectric layer over the channel layer and a gate conductive layer over the gate dielectric layer. The first conductive region is coupled to the channel layer.

In one embodiment of the present disclosure, a predetermined-shape structure of the semiconductor substrate is covered by the channel layer.

In one embodiment of the present disclosure, the predetermined-shape structure is a fin structure, and the transistor structure further includes a trench accommodating the first conductive region; wherein the first conductive region abuts against a first facet of the channel layer and a first facet of the fin structure; wherein the first conductive region includes a LDD region formed without applying an ion implantation.

In one embodiment of the present disclosure, the LDD region is formed by a selective epitaxy growth or an atomic layer deposition; and the LDD region is contacted to the first facet of the channel layer and the first facet of the fin structure.

In one embodiment of the present disclosure, the first conductive region further includes a heavily doped region positioned in the trench and abutting against the LDD region.

In one embodiment of the present disclosure, a doping concentration profile of the first conductive region laterally extending from the LDD region to the heavily doped region is controllable.

In one embodiment of the present disclosure, an interface between the LDD region and the first facet of the channel layer is substantially aligned with an edge of the gate structure.

In one embodiment of the present disclosure, the transistor structure further includes a localized isolation region in the trench, wherein the localized isolation region includes an oxide layer covering a sidewall and a bottom wall of the trench and a localized insulation plug in the trench and encompassed by the oxide layer; wherein the first conductive region is surrounded by the oxide layer and the localized insulation plug.

Yet another aspect of the present disclosure is to provide a transistor structure, wherein the transistor structure includes a semiconductor substrate, a channel layer, a gate structure, a first conductive region and a second conductive region. The semiconductor substrate includes a semiconductor surface and a predetermined-shape structure. The channel layer covers the predetermined-shape structure. The gate structure covers the channel layer. The first conductive region is coupled to the channel layer. The second conductive region is coupled to the channel layer.

In one embodiment of the present disclosure, the predetermined-shape structure is a fin structure; the channel layer includes a top portion over the semiconductor surface and a side portion covering a first sidewall and a second sidewall of the fin structure; and the transistor structure further includes a first trench accommodating the first conductive region and a second trench accommodating the second conductive region; wherein the first conductive region is independent from the semiconductor substrate and abuts against a first facet of the channel layer and a first facet of the fin structure; wherein the second conductive region is independent from the semiconductor substrate and abuts against a second facet of the channel layer and a second facet of the fin structure.

In one embodiment of the present disclosure, the channel layer is capable of preventing the fin structure from being fully-depleted.

In one embodiment of the present disclosure, the first conductive region includes a first LDD region positioned in the first trench; and abutting against a first edge of the channel layer and the first facet of the fin structure; wherein the second conductive region includes a second LDD region positioned in the second trench and abutting against a second edge of the channel layer and the second facet of the fin structure.

In one embodiment of the present disclosure, the first conductive region further includes a first heavily doped region positioned in the first trench and abutting against the first LDD region; and the second conductive region further includes a second heavily doped region positioned in the second trench and abutting against the second LDD region.

In one embodiment of the present disclosure, the channel layer, the first LDD region and the second LDD region are formed without applying an ion implantation.

In one embodiment of the present disclosure, the predetermined-shape structure is an U-shape concave; the channel layer covers a bottom wall and sidewalls of the U-shape concave; and at least part of the gate structure is within the U-shape concave structure.

One aspect of the present disclosure is to provide a transistor structure, wherein the transistor structure includes a semiconductor substrate, a channel layer, a gate structure and a first conductive region. The semiconductor substrate comprises a semiconductor surface and a fin structure. The channel layer is independent from the semiconductor substrate and covers the fin structure. The gate structure covers the channel layer. The first conductive region is coupled to the channel layer. The channel layer comprises a top portion covering a top surface of the fin structure and a side portion covering a first sidewall and a second sidewall of the fin structure, and the top portion and the side portion are not simultaneously formed.

In one embodiment of the present disclosure, a composition material of the top portion is the same as that of the side portion.

In one embodiment of the present disclosure, the composition material of the top portion or the side portion comprises doped-silicon (Si) or doped-Silicon-germanium (SiGe).

In one embodiment of the present disclosure, the composition material of the top portion or the side portion comprises a semiconductor material which is capable of generating conductive inversion caused by a potential applied to the gate structure.

In one embodiment of the present disclosure, the composition material of the top portion or the side portion is formed by a selective epitaxial growth (SEG), an atomic level deposition (ALD), a molecular beam epitaxy (MBE), or a metal-organic chemical vapor deposition (MOCVD).

In one embodiment of the present disclosure, a composition material of the top portion is different from a composition material of the side portion.

In one embodiment of the present disclosure, the gate structure comprises a gate dielectric layer, over the channel layer, and a gate conductive layer, over the gate dielectric layer.

In one embodiment of the present disclosure, the transistor structure comprises a trench, accommodating the first conductive region. The first conductive region is independent from the semiconductor substrate and abuts against a first facet of the channel layer and a first facet of the fin structure. Both the first facet of the channel layer and the first facet of the fin structure face the trench.

In one embodiment of the present disclosure, the first conductive region comprises a lightly doped drain (LDD) region positioned in the trench; and the LDD region abuts against the first edge of the channel layer and the first facet of the fin structure.

In one embodiment of the present disclosure, the first conductive region further comprises a heavily doped region positioned in the trench and abutting against the LDD region.

In one embodiment of the present disclosure, the first conductive region further comprises a metal containing region positioned in the trench and abutting against the heavily doped region.

In one embodiment of the present disclosure, the transistor structure comprises a localized isolation region in the trench and positioned under the first conductive region.

In one embodiment of the present disclosure, the localized isolation region comprise an oxide layer, covering a sidewall and a bottom wall of the trench; and a localized insulation plug, in the trench and covering a portion of the oxide layer which covers the bottom wall of the trench.

Yet another aspect of the present disclosure is to provide a transistor structure, wherein the transistor structure includes a semiconductor substrate, a channel layer, a gate structure and a first conductive region. The semiconductor substrate includes a semiconductor surface and a fin structure. The channel layer independents from the semiconductor substrate and covering the fin structure. The gate structure covers the channel layer. The first conductive region is coupled to the channel layer. The channel layer covers a first sidewall and a second sidewall of the fin structure and does not cover a top surface of the fin structure.

In one embodiment of the present disclosure, the transistor structure comprises a trench, accommodating the first conductive region. The first conductive region abuts against a first facet of the channel layer and a first facet of the fin structure. The first conductive region comprises a LDD region formed without applying an ion implantation.

In one embodiment of the present disclosure, the LDD region is formed by a selective epitaxy growth or an atomic layer deposition; and the LDD region is contacted to the first facet of the channel layer and the first facet of the fin structure.

In one embodiment of the present disclosure, the first conductive region further comprises a heavily doped region positioned in the trench and abutting against the LDD region.

In one embodiment of the present disclosure, a doping concentration profile of the first conductive region laterally extending from the LDD region to the heavily doped region is controllable.

In one embodiment of the present disclosure, an interface between the LDD region and the first facet of the channel layer is substantially aligned with an edge of the gate structure.

In one embodiment of the present disclosure, the transistor structure comprises a localized isolation region in the trench. The localized isolation region comprises an oxide layer, covering a sidewall and a bottom wall of the trench and a localized insulation plug, in the trench and encompassed by the oxide layer. The first conductive region is surrounded by the oxide layer and the localized insulation plug.

In one embodiment of the present disclosure, the channel layer is capable of preventing the fin structure from being fully-depleted.

Yet another aspect of the present disclosure is to provide a transistor structure, wherein the transistor structure includes a semiconductor substrate, a channel layer, a gate structure and a first conductive region. The semiconductor substrate includes a semiconductor surface and a fin structure. The channel layer independents from the semiconductor substrate and covering the fin structure. The gate structure covers the channel layer. The first conductive region is coupled to the channel layer. The channel layer is a doped layer formed without applying an ion implantation.

In one embodiment of the present disclosure, a doping concentration of the channel layer is between $1 \times 10^{16}$-$9 \times 10^{18}$.

In one embodiment of the present disclosure, the channel layer comprises a top portion covering a top surface of the fin structure and a side portion covering a first sidewall and a second sidewall of the fin structure.

In one embodiment of the present disclosure, the channel layer comprises a side portion covering a first sidewall and a second sidewall of the fin structure.

According to the above embodiments, new methods to create new structures of the channel regions for 3D transistors, especially on Tri-gate or FinFET devices are disclosed. In contrast to the conventional methods to create the channel regions inside both the OSS and the sidewall surfaces of the Fin, the effective channel regions in this new structure are formed above the OSS and outside the sidewall surfaces of the Fin. An additional feature is that there is no need of using ion-implantation to form the effective channel region underneath the dielectric layer of the MOSFET, thus avoiding the undesirable high-temperature Thermal Annealing process step for reducing implantation damages, which should be able to enhance the channel conductance and/or reduce leakage currents.

BRIEF DESCRIPTION OF THE DRAWINGS

The above and other aspects of the disclosure will become better understood with regard to the following detailed description of the preferred but non-limiting embodiment(s). The following description is made with reference to the accompanying drawings:

FIGS. 2A(1) to 2E(3) are respectively top views and cross-sectional views illustrating the processing structures of the step for forming the transistor as depicted in FIG. 2

FIGS. 4A(1) to 4F(2) are top views and cross-sectional views respectively illustrating the processing structures of the step for forming the transistor as depicted in FIG. 4

FIGS. 5A(1) is a top view illustrating the processing structure formed by performing the step S534 as depicted in FIG. 5;

FIG. 5A(2) is a cross-sectional view taken along the cutting line C51 as depicted in FIG. 5A(1);

FIGS. 5B (1) is a top view of the transistor structure formed by the process as depicted in FIG. 5;

FIG. 5B(2) is a cross-sectional view taken along the cutting line C52 as depicted in FIG. 513(1)

DETAILED DESCRIPTION OF THE DISCLOSURE

The present disclosure provides a transistor structure and the processing method thereof. The above and other aspects of the disclosure will become better understood by the following detailed description of the preferred but non-limiting embodiment(s). The following description is made with reference to the accompanying drawings:

Several embodiments of the present disclosure are disclosed below with reference to accompanying drawings. However, the structure and contents disclosed in the embodiments are for exemplary and explanatory purposes only, and the scope of protection of the present disclosure is not limited to the embodiments. It should be noted that the present disclosure does not illustrate all possible embodiments, and anyone skilled in the technology field of the disclosure will be able to make suitable modifications or changes based on the specification disclosed below to meet actual needs without breaching the spirit of the disclosure. The present disclosure is applicable to other implementations not disclosed in the specification.

The embodiments are described in the following by using the major portion of forming a transistor structure having a transistor channel region, a gate and source/drain regions as illustrated with schematic drawings in figures. The transistor structure adopted as an example can be an NMOS transistor; a structure for a PMOS transistor can be derived similarly except which has oppositely doped or formed materials in contrast to those of the NMOS transistor.

Embodiment 1

Figure 1:
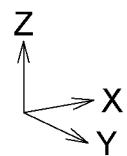
FIG. 1 is a perspective view illustrating a Tri-gate 3D channel structure of a FinFET according to the prior art.
Figure 1:
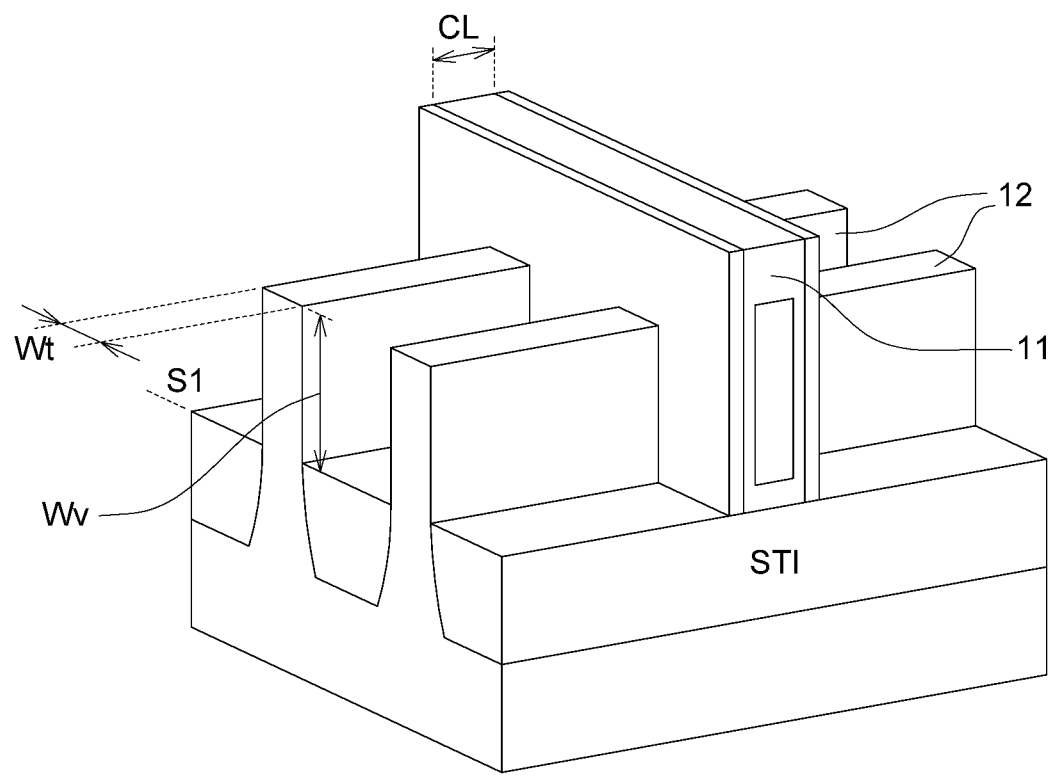
Figure 2:
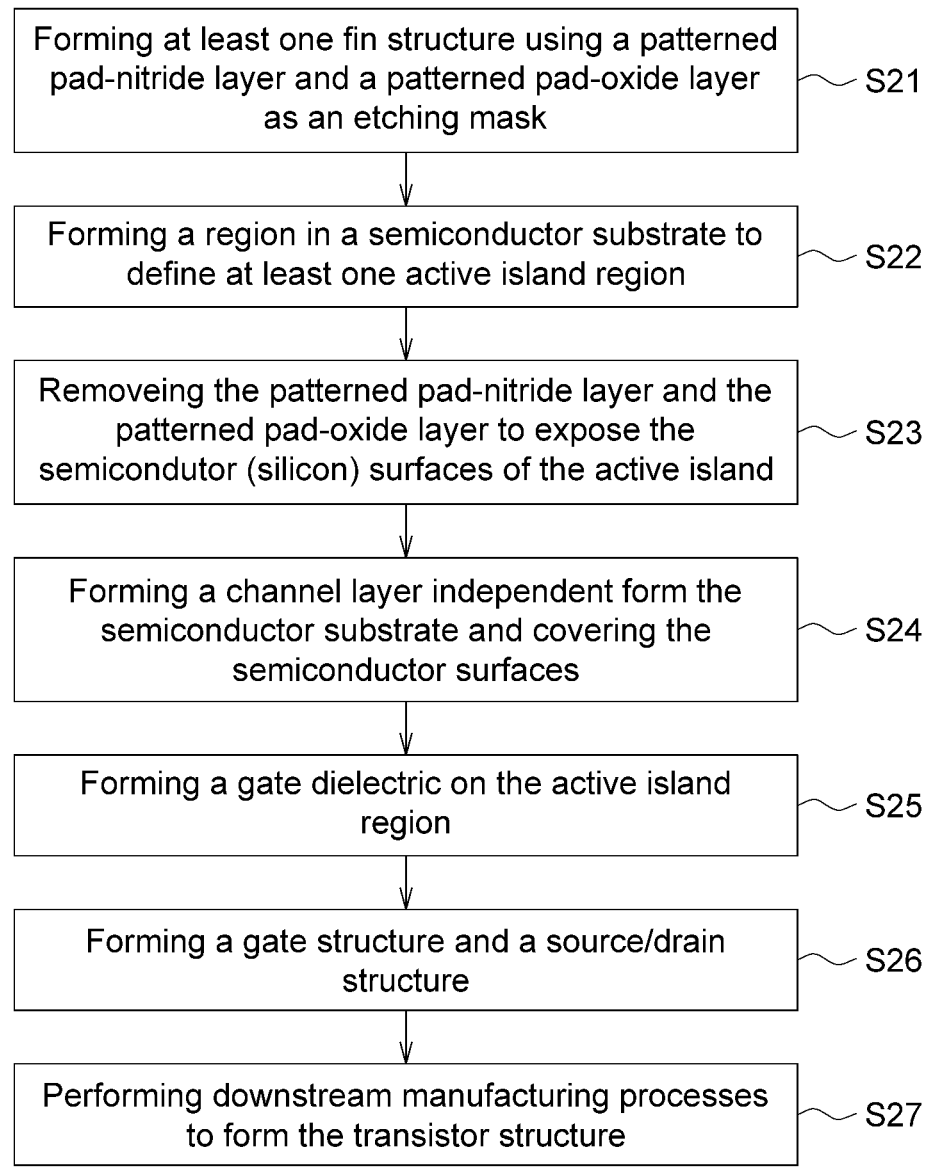
FIG. 2 is a flow chart illustrating the steps for forming a transistor structure according to one embodiment of the present disclosure.

FIG. 2 is a flow chart illustrating the steps for forming a transistor structure 20 according to one embodiment of the present disclosure. The forming of the transistor structure 20 includes steps as follows:

Step S21: forming at least one fin structure using a patterned pad-nitride layer and a patterned pad-oxide layer as an etching mask.

Step S22: forming a shallow trench isolation (STI) region in a semiconductor substrate to define at least one active island region.

Step S23: removing the patterned pad-nitride layer and the patterned pad-oxide layer to expose the semiconductor (silicon) surfaces of the active island.

Step S24: forming a channel layer independent from the semiconductor substrate and covering the semiconductor surfaces.

Step S25: forming a gate dielectric on the active island region.

Step S26: forming a gate structure and a source/drain structure.

Step S27: performing downstream manufacturing processes to form the transistor structure.

FIG. 2A(1) is a top view illustrating a structure having a patterned pad-nitride layer 204 and a patterned pad-oxide layer 205 on top of the active island region 203 which is well defined after forming a shallow trench isolation region 202 according to one embodiment of the present disclosure. FIG. 2A(2) is a cross-sectional view taken along the cutting line C21 as depicted in FIG. 2A(1) (Referring to Step S21 and S22). In the present embodiment, the active island region 203 is defined by steps as follows: a pad-nitride layer 204 and a pad-oxide layer 205 are formed in sequence to cover a surface of the semiconductor substrate 200. Next, the pad-nitride layer 204 and the pad-oxide layer 205 are patterned by a photoresist etching process, and an anisotropic etching (not shown), using the patterned pad-nitride layer 204 and the patterned pad-oxide layer 205 as an etching mask, is then performed, to remove a portion of the semiconductor substrate 200 and form the at least one fin structure 201 with a predetermined shape (such as, a U-shape concave structure). Subsequently, the STI region 202 is formed by a dielectric deposition process surrounding the fin structure 201 to define the active island region 203.

As shown in FIG. 2A(2), since the top surface 202a of STI region 202 is made below the top surface 203t (the original silicon surface (SOS)) of the fin structures 201 (active island regions 203), four silicon sidewalls 203v of the active island regions 203 above the top surface 202a of the STI region 202 are exposed.

Referring to Step S23: removing the patterned pad-nitride layer 204 and the patterned pad-oxide layer 205 to expose silicon surfaces of the active island 230. In the present embodiment, the pad-nitride layer 204 and a pad-oxide layer 205 are removed by at least one etching process, so that all five silicon surfaces, including the four silicon sidewalls 203v and the top surface 203t (SOS) of the active island 230 are exposed (see. FIGS. 2B(1) and 2B(2)).

Referring to Step S24: forming a channel layer 206 independent from the semiconductor substrate 200 and covering the semiconductor surfaces. FIG. 2C(1) is a top view illustrating a structure after the channel layer 206 is formed on the semiconductor substrate 200 and covering the semiconductor surfaces. FIG. 2C(2) is a cross-sectional view taken along the cutting line C23 as depicted in FIG. 2C(1). FIG. 2C(3) is a cross-sectional view taken along the cutting line C24 as depicted in FIG. 2C(1).

In some embodiment of the present disclosure, the forming of the channel layer 206 includes a process using a selective epitaxial growth (SEG) technique to grow an additional layer of semiconductor material with well-designed channel doping concentration (either p-type dopants for NMOS or n-type dopants for PMOS) on the active island region 230. So an efficient channel region method (ECRM) has been well accomplished with more controllability and flexibility of designing the thickness of efficient channel region (ECR) in the channel layer 206 and its conduction property (while the inverted channel region is created by the gate potential versus source/Drain potentials) than those of the conventional method of using channel implantation. This ECR not only avoids the damages induced in the channel crystalline structure caused by ion-implantation but also allows formation of an abrupt profile between the channel doping concentration and the original substrate doping concentration which should give better control of the inverted channel region at the On-condition of the transistor 200. In addition, for the Tri-gate or FinFET, as the width of the fin structure 201 should be scaled down, the conventional implantation method further narrows down the vertical channel body, this outgrown ECRM can give another dimension to control the fin structure 201.

In the present embodiment, the channel layer 206 is formed by using the SEG technique to grow an additional layer of silicon with well-designed channel doping concentration (either p-type dopants for NMOS or n-type dopants for PMOS) on the five exposed silicon surfaces, including the four silicon sidewalls 203v and the top surface 203t (SOS) of the active island region 230. In detained, the channel layer 206 includes a top portion 206a covering a top surface of the fin structure 201 (i.e., the top surface 203t (SOS)) and side portions 206b covering a first sidewall and a second sidewall (e.g., two opposite silicon sidewalls 203v of the active island region 230) of the fin structure 201. The composition material made of the top portion 206a may be the same as that of the side portions 206b; and the composition material of the top portion 206a or the side portions 206b may include doped-silicon (Si) or doped-Silicon-germanium (SiGe)).

Figure 3A:
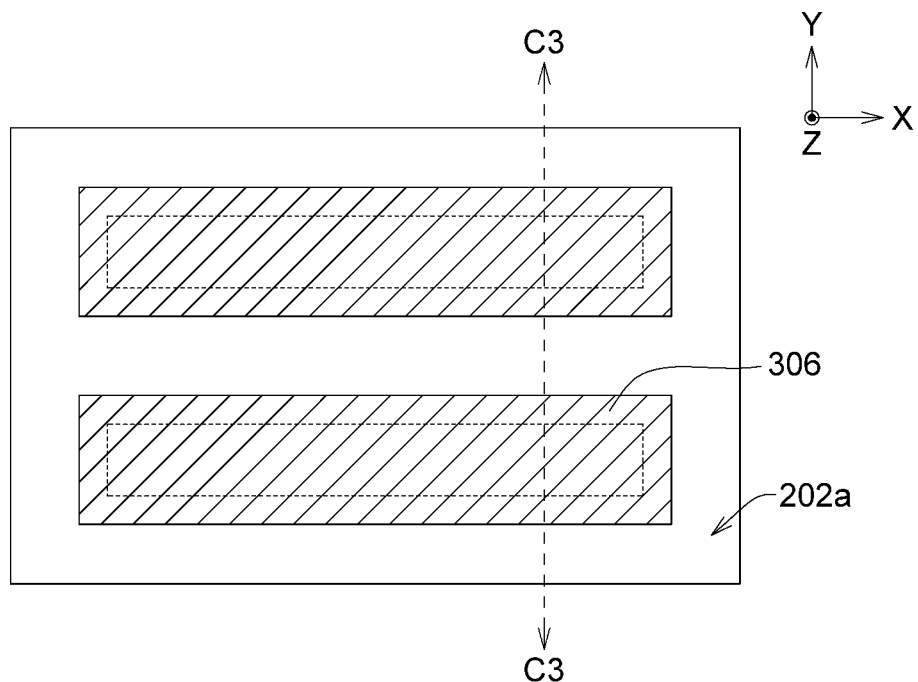
FIG. 3A is a top view illustrating a processing structures formed by performing the step S24 as depicted in FIG. 2, according another embodiment of the present disclosure.
Figure 3B:
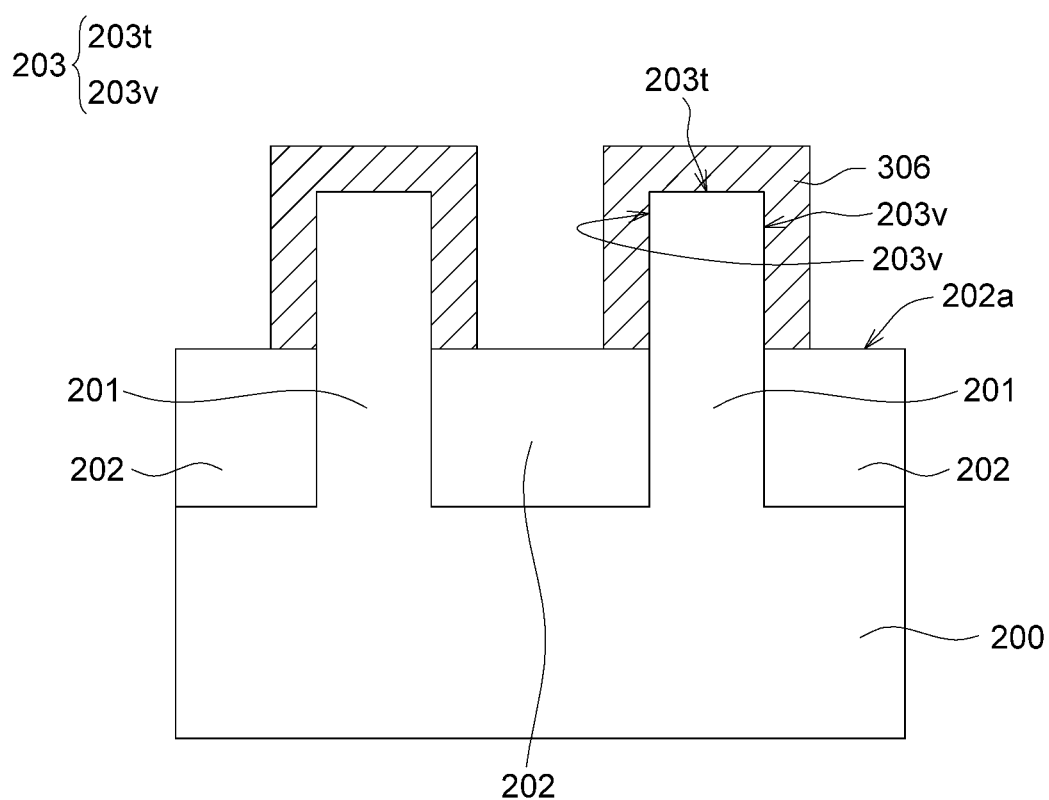
FIG. 3B is a cross-sectional view taken along the cutting line C3 as depicted in FIG. 3A.

However, the method and the composition material for forming the channel layer 206 are not limited to these regards. For example, FIG. 3A is a top view illustrating a structure after the channel layer 306 is formed on the semiconductor substrate 200 and covering the semiconductor surfaces, according to another embodiment of the present disclosure. FIG. 3B is a cross-sectional view taken along the cutting line C3 as depicted in FIG. 3A.

In the present embodiment, instead of SEG of a layer of doped silicon, using several recently developed atomic level deposition (ALD) methods or even molecular beam epitaxy (MBE) or metal-organic chemical vapor deposition (MOCVD) method to form the channel layer 306, a layer of suitable heterogeneous efficient channel region (HECR, eg., a doped silicon-germanium (SiGe), a graphene-like or a compound semiconductor, etc. as long as which can be inverted by gate-to-substrate potential) on the top surface and four sidewalls of the active island region 203. This HECR of the channel layer 306 can be used as the ECR of the channel layer 206 as shown in FIGS. 2C(1) to 2C(3).

Referring to Step S25: forming a gate dielectric 207 on the active island region 203. Now, after the ECR is well defined over the active island region 203 as using either one of the above four methods (a SEG, an ALD, a MBE or a MOCVD method), form the gate dielectric 207 over the above newly grown surface materials on top of the surfaces of the active island region 203. FIG. 2D(1) is a top view illustrating a structure after the gate dielectric 207 is formed on the active island region 203 and covering the channel layer 206 and the STI region 202. FIG. 2D(2) is a cross-sectional view taken along the cutting line C25 as depicted in FIG. 2D(1).

Referring to Step S26: forming a gate structure 28 and a source/drain structure 29. Continue forming the gate structure 28 and the source/drain structure 29 as the previous invention disclosure (U.S. patent application Ser. No. 17/314,233 filed on May 7, 2021, Title: "MOSFET STRUCTURE WITH CONTROLLABLE CHANNEL LENGTH BY FORMING LIGHTLY DOPED DRAINS WITHOUT USING ION IMPLANTATION" which claims the benefit of U.S. provisional application: 63/171,133 filed on Apr. 6, 2021, Title: "Complementary MOSFET Structure Using Novel Source/Channel/Drain Junction Structures with Buried Isolations to Reduce Leakages and Planar Areas Reserved for Preventing Latch-Up"), the whole content of the aforesaid US patent application and provisional application is incorporated by reference herein. FIG. 2E(1) is a top view illustrating a structure after the gate structure 28 and the source/drain structure 29 is formed on the active island region 203. FIG. 2E(2) is a cross-sectional view taken along the cutting line C26 as depicted in FIG. 2E(1). FIG. 2E(3) is a cross-sectional view taken along the cutting line C27 as depicted in FIG. 2E(1).

In the present embodiment, the gate structure 28 includes the gate dielectric layer 207 over the channel layer 206 and a gate conductive layer 208 over the gate dielectric layer 207. The forming of the gate structure 28 includes steps as follows: After the gate dielectric layer 207 is formed over the active island region 203, the gate conductive layer 208 is deposited above the gate dielectric layer 207, and then a nitride layer 209 (nitride-cap) and oxide layer 210 (oxide-cap) with a well-designed thickness are deposited above the gate conductive layer 208. Then the photolithographic masking technique is utilized to remove portions of the gate dielectric layer 207, the gate conductive layer 208, the nitride layer 209 and the oxide layer 210 to define the gate structure 28. wherein the gate structure 28 includes the gate layer 208 and the gate dielectric layer 207 to make the gate structure 28 have suitable metal-gate material which delivers required work-function of MIS (metal insulator to substrate) for achieving a suitable threshold voltage of the transistor structure 20 (e.g., a mMOSFET). In addition, because the top surface 202a of STI region 202 is made below the top surface 203t (the original silicon surface (SOS)) of the fin structures 201(active island region 203), the channel layer 206 covers a bottom wall and sidewalls of the U-shape concave structure of the fin structure 201; and at least part of the gate structure 28 is within the U-shape concave structure.

The forming of the source/drain structure 29 includes steps as follows: A nitride spacer 212 and an oxide spacer 213 are formed respectively covering on the four silicon sidewalls 203v and the sidewalls of the gate structure 28, and a STI-2 structure 214 is formed on the top surface 202a of STI region 202 to define a source/drain regions on the active island region 203. An anisotropic etching process is performed on the source/drain regions to remove a portion of the silicon material to form a least one trench (such as, a first trench 215a and a second trench 215b) in the active island region 203. A thermal oxide layer 216 is then formed in the trenches 215a and 215b and covering the sidewalls and the bottom wall of the trench 215, and nitride blocks 217 (also referring to as localized insulation plugs) are formed in the trenches 215a and 215b to leave a top portion of the thermal oxide layer 216 exposed. After the top portions of the thermal oxide layer 216 are etched back, the source/drain structure 29 (including a first conductive region 218 and a second conductive region 219) by a SEG, an ALD or an ALD process without applying an ion implantation.

After the relationship of location between the ECR and the source/drain structure 29 is well defined, the newly formulated channel regions which are precisely controlled on three faces of the fin structure 201 (below the gate dielectric layer 207 which is below the gate metal) can make uniformly the 3D interfaces between the fin structure 201 and seamlessly connected to source/drain structure 29.

It is worthy to mention that, the isolation region (which includes the thermal oxide layer 216, the nitride blocks 217 and the nitride spacer 212) is just under the source or drain region (which may include LDD region), and the isolation region in the present invention does not extend laterally underneath the channel region of the transistor. Therefore, such isolation region is formed localized and totally different from the traditional isolation layer in SOI under which the traditional isolation layer is a complete or pervasive isolation between the device substrate (the silicon portion on the complete or pervasive isolation) and the wafer substrate (the bulk wafer under the complete or pervasive isolation).

In the present embodiment, two localized isolation regions 220 including the nitride blocks 217 (localized insulation plugs) and the thermal oxide layer 216 can be defied in the trenches 215a and 215b to surrounding the first conductive region 218 and the second conductive region 219. In detailed, the first conductive region 218 that is composed of a first heavily doped region 218a and a first LDDE region 218b is positioned in the trench 215a and independent from the semiconductor substrate 200 and abuts against a first facet 20c of the channel layer 206 and a first facet (one of the sidewalls 203v of the active island region 203) of the fin structure 201. The second conductive region 219 that is compose of a second heavily doped region 219a and a second LDD region 219b is positioned in the trench 215b and independent from the semiconductor substrate 200 and abuts against a second facet 206d of the channel layer 206 and a first facet (another sidewall 203v of the active island region 203) of the fin structure 201.

The first heavily doped region 218a abuts against the first LDD region 218b, and the first LDD region 218b abuts against the first edge (facet) 206c of the channel layer 206 and the first facet (one of the sidewalls 203v of the active island region 203) of the fin structure 201. The second heavily doped region 219a abuts against the second LDD region 219b, and the second LDD region 219b abuts against the second edge (facet) 206d of the channel layer 206 and the second facet (another sidewalls 203v of the active island region 203) of the fin structure 201. An interface 211a between the first LDD region 218b and the first facet 206c of the channel layer 206 is substantially aligned with an edge of the gate structure 28; an interface 211b between the second LDD region 219b and the second facet 206d of the channel layer 206 is substantially aligned with another edge of the gate structure 28.

Referring to Step S27: performing downstream manufacturing processes to form the transistor structure 20. Continue forming the structure 28 and a source/drain structure 29 as the previous disclosure, a serious of downstream process manufacturing process (such as, the process for forming a metal interconnection structure 220) are performed, and the process for forming the transistor structure 20 as shown in FIGS. 2E(1) and 2E(2) can be implemented.

Embodiment 2

Figure 4:
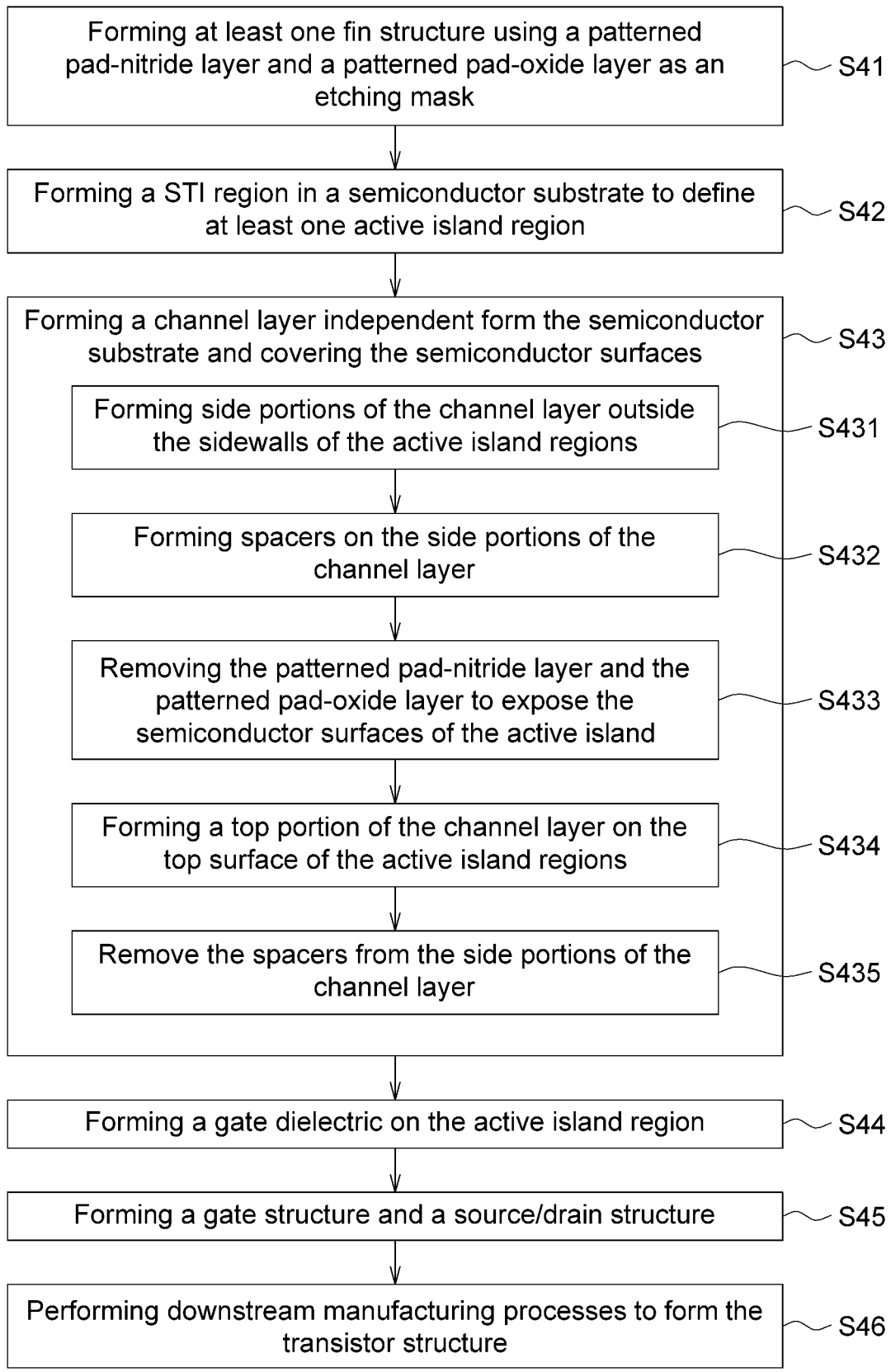
FIG. 4 is a flow chart illustrating the steps for forming a transistor structure according to yet another embodiment of the present disclosure.

FIG. 4 is a flow chart illustrating the steps for forming a transistor structure 40 according to one embodiment of the present disclosure. The method for forming of the transistor structure 40 includes steps as follows:

Step S41: forming at least one fin structure using a patterned pad-nitride layer and a patterned pad-oxide layer as an etching mask.

Step S42: forming a STI region in a semiconductor substrate to define at least one active island region.

Step 43: forming a channel layer independent from the semiconductor substrate and covering the semiconductor surfaces.

S431: forming side portions of the channel layer outside the sidewalls of the active island regions.

Step S432: forming spacers on the side portions of the channel layer.

Step S433: removing the patterned pad-nitride layer and the patterned pad-oxide layer to expose the semiconductor surfaces of the active island.

Step S434: forming a top portion of the channel layer on the top surface of the active island regions.

Step S435: remove the spacers from the side portions of the channel layer.

Step S44: forming a gate dielectric on the active island region.

Step S45: forming a gate structure and a source/drain structure.

Step S46: performing downstream manufacturing processes to form the transistor structure.

Since the method for forming of the transistor structure 40 is similar to that for forming of the transistor structure 20 as depicted in FIGS. 2 to 2E(2), expect the process for forming the channel layer 406, and the steps S41 to S42 are identical to that of the method for forming of the transistor structure 20, thus detail procedural and the material applied thereof will not redundantly described here. The process for forming of the transistor structure 40 are described from step S43.

Referring to Step S43: forming a channel layer 406 independent from the semiconductor substrate 200 and covering the semiconductor surfaces. An ECR (a top portion 406a of the channel layer 406) on the top surface of the fin structure 201 and other ECRs (in the side portions 406b of the channel layer 406) outside the four sidewalls (silicon sidewalls 203v of the active island regions 203) of the fin structure 201 can be separately formed, thus giving more freedom in designing the threshold voltage and/or controlling device properties diversely or differently. The forming of the channel layer 406 may include several sub-steps S431 to S435.

Referring to Step S431: forming side portions 406b of the channel layer 406 outside the sidewalls of the active island regions 203. FIG. 4A(1) is a top view illustrating a structure after the side portions 406b of the channel layer 406 is formed outside the sidewalls of the active island regions 203. FIG. 4A(2) is a cross-sectional view taken along the cutting line C41 as depicted in FIG. 4A(1). Without removing both of the pad-nitride layer 204 and a patterned pad-oxide layer 205, so that only four silicon surfaces (silicon sidewalls 203v) of the active island are exposed but the top surface 203t of the fin structure 201 is not exposed. Use a SEG technique to grow an additional layer of silicon with well-designed channel doping concentration to form a layer of CRE (also referred to as the side portions 406b of the channel layer 406). It is noted that the ECR is only formed on the four sidewalls of the active island region 203.

Referring to Step S432: forming spacers on the side portions 406b of the channel layer 406. FIG. 4B(1) is a top view illustrating a structure after the spacers are formed on the side portions 406b of the channel layer 406. FIG. 4B(2) is a cross-sectional view taken along the cutting line C42 as depicted in FIG. 4A(1).Then grow a thin layer of oxide thermally 421 over the ECR (the side portions 406b of the channel layer 406) and then use the spacer forming technique to define nitride spacers 422 covering the four sidewalls which have already the ECR.

Referring to Step S433: removing the patterned pad-nitride layer 204 and the patterned pad-oxide layer 205 to expose the semiconductor surfaces of the active island region 203. FIG. 4C(1) is a top view illustrating a structure after the patterned pad-nitride layer 204 and the patterned pad-oxide layer 205 are removed. FIG. 4C(2) is a cross-sectional view taken along the cutting line C43 as depicted in FIG. 4C(1). Then use an anisotropic etching technique remove the pad-nitride layer 204 and a patterned pad-oxide layer 205, so that the OSS over the top surface 203t of the active island regions 230 is exposed but the ECR over the four sidewalls of the active island regions 230 are well protected.

Referring to Step S434: forming a top portion 406a of the channel layer 406 on the top surface 203t of the active island regions 230. FIG. 4D(1) is a top view illustrating a structure after the top portion 406a of the channel layer 406 is formed on the top surface 203t of the active island regions 230. FIG. 4D(2) is a cross-sectional view taken along the cutting line C44 as depicted in FIG. 4D(1). Use a SEG technique to grow an additional layer of silicon with well-designed channel doping concentration or to form a layer of HCER (as shown in FIGS. 3A and 3B) serving as the top portion 406a of the channel layer 406. It is noted that for this time the ECR (the top portion 406a of the channel layer 406) is only formed on the top surface 203t of the active Island regions 203 without growing over the four sidewalls 203v of the active Island regions 203. In the present embodiment, the composed material of the top portion 406a of the channel layer 406 is doped-SiG. Of course, in another embodiment, the top portion 406a of the channel layer 406 is optional and could be omitted, and ECR over the sidewalls of the active island regions 230 is used.

Referring to Step S435: remove the spacers from the side portions 406b of the channel layer 406. FIG. 4E(1) is a top view illustrating a structure after the spacers are removed from the side portions 406b of the channel layer 406. FIG. 4E(2) is a cross-sectional view taken along the cutting line C45 as depicted in FIG. 4D(1). Then use an isotropic etching technique to remove the nitride spacers 422 and the thin layer of oxide thermally 421 underneath the nitride spacers 422 which are on those four sidewalls 203v over the active island regions 203 (and over the side portions 406b of the channel layer 406).

Subsequently, a gate dielectric 207 is forming on the active island regions 203 (Referring to Step S44); a gate structure 28 and a source/drain structure 29 are then formed (Referring to Step S45); and a serious of downstream process manufacturing process (Referring to Step S46) are performed, and the process for forming the transistor structure 40 as shown in FIGS. 4F(1) and 4F(2)(a cross-sectional view taken along the cutting line C46 as depicted in FIG. 4F(1)) can be implemented. Since the steps S44 to S46 the same as the steps S425 to S27 as depicted in FIG. 2, thus the detail procedural and the material applied thereof will not redundantly described here.

Embodiment 3

Figure 5:
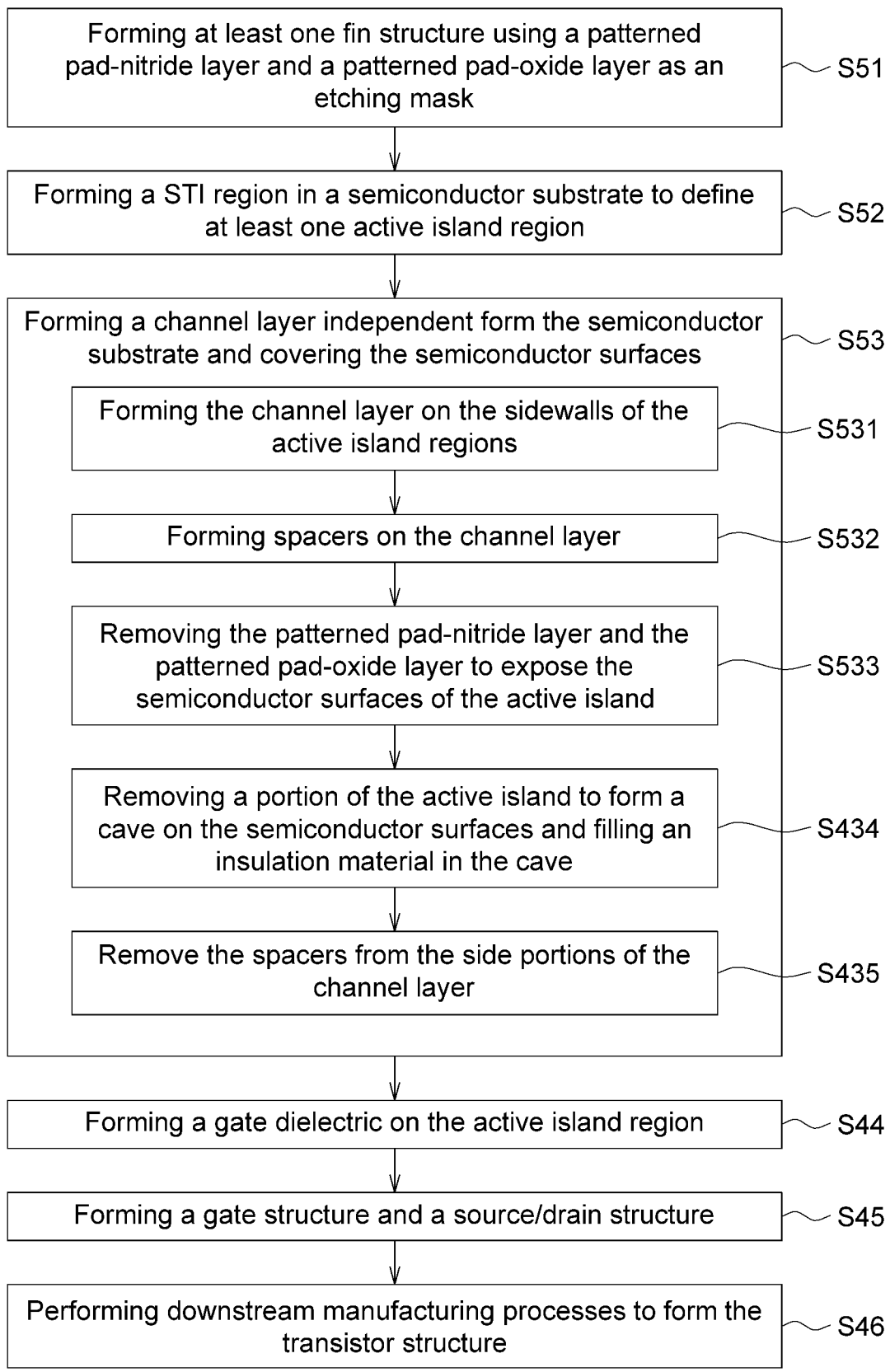
FIG. 5 is a flow chart illustrating the steps for forming a transistor structure according to yet another embodiment of the present disclosure.

FIG. 5 is a flow chart illustrating the steps for forming a transistor structure 50 according to one embodiment of the present disclosure. The method for forming of the transistor structure 50 includes steps as follows:

Step S51: forming at least one fin structure using a patterned pad-nitride layer and a patterned pad-oxide layer as an etching mask.

Step S52: forming a STI region in a semiconductor substrate to define at least one active island region.

Step 53: forming a channel layer independent from the semiconductor substrate and covering the semiconductor surfaces.

Step S531: forming the channel layer on the sidewalls of the active island regions.

Step S532: forming spacers on the channel layer.

Step S533: removing the patterned pad-nitride layer and the patterned pad-oxide layer to expose the semiconductor surfaces of the active island.

Step S534: removing a portion of the active island to form a cave on the semiconductor surfaces and filling an insulation material in the cave.

Step S535: remove the spacers from the side portions of the channel layer.

Step S54: forming a gate dielectric on the active island region.

Step S55: forming a gate structure and a source/drain structure.

Step S56: performing downstream manufacturing processes to form the transistor structure.

Since the method for forming of the transistor structure 50 is similar to that for forming of the transistor structure 40 as depicted in FIGS. 4 to 4F(2), expect the process for forming the channel layer 506, and the steps S51 to S533 are identical to that of the method for forming of the transistor structure 40, thus detail procedural and the material applied thereof will not redundantly described here. The process for forming of the transistor structure 50 are described from step S534, after the channel layer 506 is formed outside the sidewalls of the active island regions 203.

Referring to Step S534: removing a portion of the active island to form a cave 523 on the semiconductor surfaces, and filling an insulation material 522 in the cave 523. FIG. 5A is a top view illustrating a structure after the cave 523 is formed on the semiconductor surface. FIG. 5B is a cross-sectional view taken along the cutting line C51 as depicted in FIG. 5A. Use a selective etching technique to remove the exposed OSS (the top surface 203t of the active island regions 203) below a certain level to form the cave 523. Then use a selective growth technique of insulation material 522, such as thick oxide, filling into the top hallow portion above the exposed silicon cave 523 so that the two ECRs (the channel layer 506) on two sidewalls 203v of the active island regions 203 are fully isolated. This does not use the Tri-gate structure to avoid the non-uniform conductive mechanism may happen on the top two corners due to existing sharp angles.

Subsequently, the spacers are removed from the side portions of the channel layer (Referring to Step S535); a gate dielectric 207 is forming on the active island region 203 (Referring to Step S54); a gate structure 28 and a source/drain structure 29 are then formed (Referring to Step S55); and a serious of downstream process manufacturing process (Referring to Step S56) are performed, and the process for forming the transistor structure 50 as shown in FIGS. 5B(1) and 5B(2) can be implemented. Since the steps S535 to S56 are the same as the steps S435 to S46 as depicted in FIG. 4, thus the detail procedural and the material applied thereof will not redundantly described here.

The key feature in these embodiments is to create an additional layer (such as the channel layer 206, 306, 406 and 506) of desired doping concentrations as the transistor real physical channel ECR by either SEG layers of using either doped silicon or other doped heterogeneous materials which can enhance the channel performance but eliminate using the conventional ion-implantation method of create the channel region.

Figure 6:
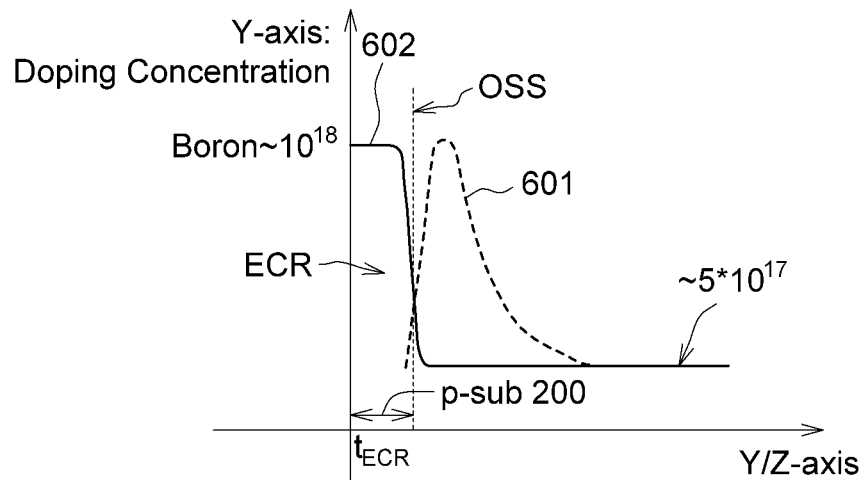
FIG. 6 is a diagram illustrating the doping concentration profile through a conventional way of forming the doped channel region by using both ion-implantation and thermal processes versus through forming an ECR by using in-situation doping growth mechanism disclosed in FIGS. 2A(1) to 2E(3)

FIG. 6 is a diagram illustrating the doping concentration profile through a conventional way of forming the doped channel region by using both ion-implantation and thermal processes versus through forming an ECR by using in-situation doping growth mechanism disclosed in the aforementioned embodiment 1. The conventional way results 601 in a Poisson distribution of p-channel dopants (boron) for NMOS which has its tail distributed into the silicon substrate: this may cause the threshold voltage more difficult to control than that of the embodiment 1 which has a sharp-transition dopant concentration profile 602 changed from the ECR (around the channel layer 206) to the p-substrate 200. By judging from these two different dopant concentration results, the ECR which changed from a non-conductive region to a conductive mode between the source and the drain regions by modulating the gate voltage should behave much better like an ideal channel than the conventional spreading channel dopant profile can provide. In one embodiment, the doping concentration of the ECR could be between $1\times10^{16}$~$9\times10^{18}$, as long as the ECR would become depletion region when there is no voltage applied on the gate of the transistor and would form inversion region when an operation voltage is applied on the gate of the transistor.

Figure 7:
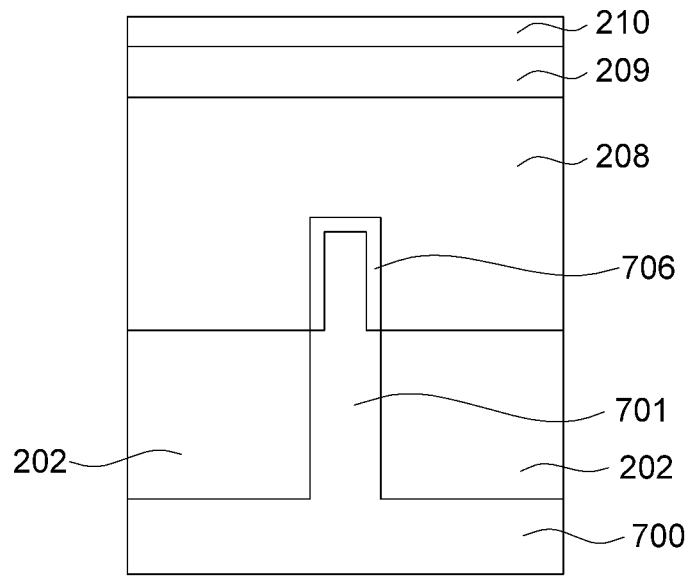
FIG. 7 is a cross-sectional view illustrating a Tri-gate 3D channel structure of a FinFET according to the prior art.

Referring to FIG. 2E(3) again, it shows a cross-section along the Y-direction of this new FinFET structure (the transistor structure 200) which uses this ECR channel (around the channel layer 206) to be connected to both source an drain regions which can also avoid using ion-implantation to form LDD (the first LDD region 218b and the second LDD region region) and n+ drain/source regions (the drain/source structure 29). In contrast, the cross-section of using a conventional way to form n+ source/drain regions of a FinFET structure 70 (see FIG. 7), where the channel dopant concentration profile 706 is made inside the semiconductor substrate body 700, which not only makes the threshold voltage more difficult to be controlled but also the effective substrate region 700 of the fin structure 701 much thinner and less controllable for the transistor 70 active performance.

In the aforementioned embodiments, the efficient channel region (ECR) is just like a channel layer 206 (306, 406 or 506) under the gate structure 28, and when a suitable potential is applied to the gate terminal of the transistor 20 (40 or 50), conductive inversion is induced within ECR or the channel layer (that is, the accumulated minor carriers within the channel layer is large enough to conduct the current) such that the drain terminal and the source terminal are electrically connected together through the ECR or the channel layer. Therefore, the ECR or the channel layer is a selectively conductive layer. Furthermore, with the help of ECR, it is possible to prevent the original fin structure from fully depleted.

It should be appreciated that the aforesaid ECR could not only be applied to fin-structure transistors, but also applied to other transistors, such as planar transistor (in such case, the ECR is formed on the original silicon surface) or transistor with concave gate structure deposited in an U-shape concave (in such case, the ECR could be formed along the surface of U-shape concave). The major point is that, there is an additionally formed ECR (or HECR) independent from the original silicon substrate, and such ECR (or HECR) covers the original surface of the substrate or the surface of any predetermined-shape structure which could be formed by etching the substrate. The present invention could utilize the ECR as a major conductive channel to connect the Source and Drain, rather than a channel within the silicon substrate to connect the source and drain by the traditional transistor.

This disclosure really opens a door to adopt some unique materials for 3D conduction channel layers so as to achieve more controllable threshold voltage for FET. In addition, try to make silicon fins not necessarily fully depleted but with a neutral bulk connected to the substrate voltage, thus extending the FinFET life by maintaining wider Fins with lower Height. Increase the widths of both Fin and Source/Drain with no need to sharply reduce the width of the Fin. It totally avoids using Ion-implantation to create ECR inside the Fin body so that there is no need to proceed to a hot step of using high-temperature thermal annealing process which is not the best desirable process in the continuously scaling devices.

In sum, using this method as described above to form an outgrowing ECR over the fin structure plus using the laterally grown LDD and heavily doped source/drain electrodes with totally avoiding using ion-implantation to introduce dopants of an ECR inside the fin without remedy's on crystalline damages by thermal annealing process is a completely new way of making high-quality, low leakage and high performance FinFET or Tri-gate transistor for the first time. Therefore, in the present disclosure, features and advantages are summarized as follows:

1. For a 3D transistor such as FinFET or Tri-gate structure an efficient channel layer (ECR) under the gate and its dielectric can be modulated as on or off state is created outside the fin-shape transistor body area;
2. The ECR can be either a well-designed doped silicon material or non-silicon material;
3. The ECR on top of the fin can be made separately from the ECR outside the two sidewalls of the fin;
4. The ECR can be created by various CVD growth mechanisms, eg. selective epitaxial growth of well-design doped silicon layer, ALD of various materials for suitable channel structure;
5. There is no need of using ion implantation for forming the channel region into the Fin surfaces and thus no need for thermal annealing to activate those implanted ions.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A transistor structure comprising:
a semiconductor substrate comprising a semiconductor surface and a fin structure;
a channel layer grown from the semiconductor substrate and covering the fin structure;
a gate structure covering the channel layer; and
a source or drain structure comprising a first conductive region coupled to the channel layer, wherein a bottom surface of the source or drain structure is isolated from the semiconductor substrate by a localized isolation region positioned under the first conductive region and comprising an L-shaped oxide layer;
wherein the channel layer comprises a top portion covering a top surface of the fin structure and a side portion covering a first sidewall and a second sidewall of the fin structure, and a composition material of the top portion is same as or different from that of the side portion.

2. The transistor structure according to claim 1, wherein the composition material of the top portion is the same as that of the side portion.

3. The transistor structure according to claim 1, wherein the composition material of the top portion or the side portion comprises doped-silicon (Si) or doped-Silicon-germanium (SiGe).

4. The transistor structure according to claim 2, wherein the composition material of the top portion or the side portion comprises a semiconductor material which is capable of generating conductive inversion caused by a potential applied to the gate structure.

5. The transistor structure according to claim 2, wherein the composition material of the top portion or the side portion is formed by a selective epitaxial growth (SEG), an atomic level deposition (ALD), a molecular beam epitaxy (MBE), or a metal-organic chemical vapor deposition (MOCVD).

6. The transistor structure according to claim 1, wherein the gate structure comprises:
a gate dielectric layer, over the channel layer; and
a gate conductive layer, over the gate dielectric layer.

7. The transistor structure according to claim 1, further comprising a trench, accommodating the first conductive region;
wherein the first conductive region comprises an epitaxial region and abuts against a first edge of the channel layer and a first facet of the fin structure; and
wherein both the first edge of the channel layer and the first facet of the fin structure face the trench.

8. The transistor structure according to claim 7, wherein the first conductive region comprises a lightly doped drain (LDD) region positioned in the trench; and the LDD region abuts against the first edge of the channel layer and the first facet of the fin structure.

9. The transistor structure according to claim 8, wherein the first conductive region further comprises a heavily doped region positioned in the trench and abutting against the LDD region.

10. The transistor structure according to claim 9, wherein the first conductive region further comprises a metal containing region positioned above the trench and -abutting against the heavily doped region.

11. The transistor structure according to claim 7, wherein the localized isolation region is in the trench.

12. The transistor structure according to claim 11, wherein the localized isolation region further comprises a localized insulation plug in the trench and covering a portion of the L-shaped oxide layer.

13. A transistor structure, comprising:
a semiconductor substrate comprising a semiconductor surface and a fin structure;
a channel layer grown from the semiconductor substrate and covering the fin structure;
a gate structure covering the channel layer; and
a source or drain structure comprising a first conductive region coupled to the channel layer, wherein a bottom surface of the source or drain structure is isolated from the semiconductor substrate;
wherein the channel layer comprises a top portion covering a top surface of the fin structure and a side portion covering a first sidewall and a second sidewall of the fin structure, and the top portion and the side portion are not simultaneously formed; wherein a composition material of the top portion is different from a composition material of the side portion.

14. A transistor structure comprising:
a semiconductor substrate comprising a semiconductor surface and a fin structure;
a channel layer grown from the semiconductor substrate and covering the fin structure;
a gate structure covering the channel layer; and
a first conductive region coupled to the channel layer;
wherein the channel layer comprises a top portion covering a top surface of the fin structure and a side portion covering a first sidewall and a second sidewall of the fin structure, and the top portion and the side portion are not simultaneously formed, wherein a composition material of the top portion is different from a composition material of the side portion.

15. A transistor structure comprising:
a semiconductor substrate comprising a semiconductor surface and a fin structure;
a channel layer grown from the semiconductor substrate and covering the fin structure;
a gate structure covering the channel layer;
a first conductive region coupled to the channel layer; and
a trench, accommodating the first conductive region;
wherein the first conductive region comprises an epitaxial region and abuts against a first edge of the channel layer and a first facet of the fin structure; wherein both the first edge of the channel layer and the first facet of the fin structure face the trench; and wherein a bottom surface of the first conductive region is isolated from the semiconductor substrate by a localized isolation region positioned under the first conductive region and comprising an L-shaped oxide layer.

16. The transistor structure according to claim 15, wherein the first conductive region comprises a lightly doped drain (LDD) region positioned in the trench; and the LDD region abuts against the first edge of the channel layer and the first facet of the fin structure.

17. The transistor structure according to claim 16, wherein the first conductive region further comprises a heavily doped region positioned in the trench and abutting against the LDD region.

18. The transistor structure according to claim 17, wherein the first conductive region further comprises a metal containing region positioned above the trench and abutting against the heavily doped region.

19. The transistor structure according to claim 15, wherein the localized isolation region is in the trench and positioned under the first conductive region.

20. A transistor structure, comprising:
a semiconductor substrate comprising a semiconductor surface and a fin structure;
a channel layer grown from the semiconductor substrate and covering the fin structure;
a gate structure covering the channel layer;
a first conductive region coupled to the channel layer;
a trench, accommodating the first conductive region; wherein the first conductive region comprises an epitaxial region and abuts against a first edge of the channel layer and a first facet of the fin structure; wherein both the first edge of the channel layer and the first facet of the fin structure face the trench; and
a localized isolation region in the trench and positioned under the first conductive region; wherein the localized isolation region comprising:
an oxide layer, covering a sidewall and a bottom wall of the trench; and
a localized insulation plug, in the trench and covering a portion of the oxide layer which covers the bottom wall of the trench.

21. A transistor structure comprising:
a semiconductor substrate comprising a semiconductor surface and a fin structure;
a channel layer grown from the semiconductor substrate and covering the fin structure; wherein the channel layer comprises a top portion covering a top surface of the fin structure and a side portion covering a first sidewall and a second sidewall of the fin structure, and the top portion and the side portion are not simultaneously formed;
a gate structure covering the channel layer;
a source or drain structure comprising a first conductive region coupled to the channel layer, wherein a bottom surface of the source or drain structure is isolated from the semiconductor substrate; wherein the first conductive region comprises an epitaxial region and abuts against a first edge of the channel layer and a first facet of the fin structure;
a trench, accommodating the first conductive region; wherein both the first edge of the channel layer and the first facet of the fin structure face the trench; and
an localized isolation region, in the trench, positioned under the first conductive region; wherein the localized isolation region comprises an L-shaped oxide layer.

22. A transistor structure comprising:
a semiconductor substrate comprising a semiconductor surface and a fin structure;
a channel layer grown from the semiconductor substrate and covering the fin structure;
a gate structure covering the channel layer;
a source or drain structure comprising a first conductive region coupled to the channel layer, wherein a bottom surface of the source or drain structure is isolated from the semiconductor substrate by a localized isolation region positioned under the first conductive region and comprising an L-shaped oxide layer;
wherein the channel layer comprises a top portion covering a top surface of the fin structure and a side portion covering a first sidewall and a second sidewall of the fin structure, and the top portion and the side portion are not simultaneously formed; and
a trench, accommodating the first conductive region; wherein the first conductive region comprises an epitaxial region and abuts against a first edge of the channel layer and a first facet of the fin structure; and
wherein both the first edge of the channel layer and the first facet of the fin structure face the trench; and the localized isolation region further comprises a localized insulation plug in the trench and covering a portion of the L-shaped oxide layer.

* * * * *